United States Patent
Kadowaki et al.

(10) Patent No.: US 9,853,070 B2
(45) Date of Patent: Dec. 26, 2017

(54) METHOD OF MANUFACTURING DISPLAY PANEL SUBSTRATE

(71) Applicant: Sharp Kabushiki Kaisha, Sakai, Osaka (JP)

(72) Inventors: Shinya Kadowaki, Sakai (JP); Hidefumi Yoshida, Sakai (JP)

(73) Assignee: Sharp Kabushiki Kaisha, Sakai (JP)

( * ) Notice: Subject to any disclaimer, the term of this patent is extended or adjusted under 35 U.S.C. 154(b) by 0 days.

(21) Appl. No.: 15/513,173

(22) PCT Filed: Dec. 2, 2015

(86) PCT No.: PCT/JP2015/083864
§ 371 (c)(1),
(2) Date: Mar. 22, 2017

(87) PCT Pub. No.: WO2016/093122
PCT Pub. Date: Jun. 16, 2016

(65) Prior Publication Data
US 2017/0301706 A1    Oct. 19, 2017

(30) Foreign Application Priority Data

Dec. 9, 2014  (JP) ................................. 2014-248706

(51) Int. Cl.
H01L 29/16    (2006.01)
H01L 27/00    (2006.01)
H01L 27/12    (2006.01)

(52) U.S. Cl.
CPC ........ H01L 27/1288 (2013.01); H01L 27/127 (2013.01)

(58) Field of Classification Search
None
See application file for complete search history.

(56) References Cited

U.S. PATENT DOCUMENTS

2001/0055733 A1* 12/2001 Irie .................... G03F 7/201
430/396
2003/0022071 A1*  1/2003 Sugita .............. G03F 7/203
430/5
(Continued)

FOREIGN PATENT DOCUMENTS

JP    08-288202 A    11/1996
JP    11-154639 A     6/1999
(Continued)

OTHER PUBLICATIONS

Official Communication issued in International Patent Application No. PCT/JP2015/083864, dated Feb. 9, 2016.

*Primary Examiner* — Alexander Ghyka
(74) *Attorney, Agent, or Firm* — Keating & Bennett, LLP

(57) ABSTRACT

A method of manufacturing a display panel substrate having a semiconductor element includes a film forming step of forming a thin film, a resist film forming step of forming a positive resist film on the thin film, a first exposure step of selectively exposing a resist film via a photomask including a pattern of the semiconductor element, a second exposure step of selectively exposing the resist film by scanning and irradiating the resist film with light along an outline shape of the display panel substrate, a developing step of developing the resist film to remove the resist film exposed in the first and second exposure steps and form a resist pattern on the thin film, an etching step of etching the thin film using the resist pattern as a mask, and forming a thin-film pattern by selectively removing the thin film, and a peeling step of peeling the resist pattern.

4 Claims, 20 Drawing Sheets

(56) References Cited

U.S. PATENT DOCUMENTS

| | | | |
|---|---|---|---|
| 2010/0163876 A1* | 7/2010 | Inoue | G02F 1/133553 257/59 |
| 2012/0028391 A1* | 2/2012 | Tanaka | H01L 27/1214 438/34 |
| 2012/0305911 A1* | 12/2012 | Iwasaka | H01L 27/1225 257/43 |
| 2013/0235318 A1* | 9/2013 | Kawasaki | H01L 29/458 349/143 |
| 2014/0248748 A1* | 9/2014 | Kawamura | H01L 27/12 438/151 |
| 2014/0327889 A1 | 11/2014 | Yamazaki et al. | |
| 2016/0013210 A1* | 1/2016 | Li | H01L 27/124 257/72 |
| 2017/0141139 A1* | 5/2017 | Wang | H01L 27/1288 |

FOREIGN PATENT DOCUMENTS

| | | | |
|---|---|---|---|
| JP | 2001-142224 A | 5/2001 | |
| JP | 2002-014367 A | 1/2002 | |
| JP | 2009-110793 A | 5/2009 | |
| JP | 2010-026421 A | 2/2010 | |
| JP | 2012-222044 A | 11/2012 | |
| JP | 2013-015644 A | 1/2013 | |
| JP | 2013-156655 A | 8/2013 | |

\* cited by examiner

METHOD OF MANUFACTURING DISPLAY PANEL SUBSTRATE

TECHNICAL FIELD

The technology disclosed in the present description relates to a method of manufacturing a display panel substrate provided with a semiconductor element.

BACKGROUND ART

During the process of manufacturing a display panel constituting a display device, a display panel substrate provided with semiconductor elements, such as TFTs (Thin Film Transistors), may be used. Fine patterns that constitute the various electrodes and the like of the semiconductor elements are formed by patterning a metal film and the like on the substrate, using photolithography process which involves exposure and development with the use of a photomask having the patterns. For example, Patent Document 1 indicated below discloses a method of manufacturing an organic EL display device. The method includes forming organic EL elements arranged in a matrix on a substrate by photolithography process using an exposure mask having patterns (photomask).

PRIOR ART DOCUMENT

Patent Document

Patent Document 1 Japanese Unexamined Patent Publication No. 2009-110793

Problem to be Solved by the Invention

To the display panel substrate provided with the TFTs, a gate driver and a source driver for driving the TFTs are connected. The gate driver and source driver are generally both connected to the edge of the display panel. In recent years, however, as a result of decreases made in the element size of TFTs, a substrate including a gate driver in the pixel region has been developed.

In general, the display panel substrate constituting the display device has a rectangular or square outline shape as viewed in plan. In recent years, by disposing the gate driver in the pixel as mentioned above, it has become possible to process a large portion of the edge portion of the display panel. Accordingly, the display panel substrates having various outline shapes, such as a semicircular shape or trapezoidal shape as viewed in plan, have been manufactured.

When the outline shape of the display panel substrate is thus varied, it is necessary, during the display panel substrate manufacturing process, to prepare a photomask for each different outline shape for patterning in the shape corresponding to the outline shape. However, the photomask is very costly. Accordingly, if a photomask is to be separately prepared for each different outline shape of the display panel substrate, the manufacturing cost of the display panel substrate increases.

DISCLOSURE OF THE PRESENT INVENTION

The technology disclosed in the present description has been created in view of the above problem. An object of the technology is to manufacture a display panel substrate having a desired outline shape while achieving a decrease in manufacturing cost.

Means for Solving the Problem

The technology disclosed in the present description relates to a method of manufacturing a display panel substrate having a semiconductor element. The method includes a film forming step of forming a thin film on the substrate; a resist film forming step, after the film forming step, of forming a positive resist film on the thin film; a first exposure step, after the resist film forming step, of selectively exposing a part of the resist film via a photomask including a pattern corresponding to at least a pattern of the semiconductor element; a second exposure step, after the first exposure step, of selectively exposing a part of the resist film by scanning and irradiating the resist film with light along an outline shape of the display panel substrate; a developing step, after the second exposure step, of developing the resist film so as to form a resist pattern on the thin film by removing a part of the resist film that is exposed in the first exposure step and the second exposure step; an etching step, after the developing step, of etching the thin film using the resist pattern as a mask, so as to selectively remove a part of the thin film and form a thin-film pattern; and a peeling step, after the etching step, of peeling the resist pattern from the thin-film pattern.

In the method for manufacturing a display panel substrate, in the first exposure step, a part of the resist film is exposed via the photomask, whereby a portion of the resist film except for the pattern corresponding to the fine pattern of the semiconductor element can be exposed with high accuracy. In the second exposure step, the resist film is scanned and irradiated with light along the outline shape of the display panel substrate, whereby the portion of the resist film along the outline shape of the display panel substrate can be exposed without using a photomask. Then, in the developing step, the parts of the resist film that have been exposed in the first exposure step and the second exposure step are removed, whereby a resist pattern with an outline portion having a shape corresponding to the outline shape of the display panel substrate can be formed. By performing the etching step and the peeling step using the resist pattern as a mask, a thin-film pattern with an outline portion having a shape corresponding to the outline shape of the display panel substrate can be formed on the substrate. Thereafter, by cutting the substrate along the outline shape of the display panel substrate, a display panel substrate having a desired outline shape can be manufactured.

Thus, according to the manufacturing method, the outline portion of the pattern of the semiconductor element can be patterned into the shape corresponding to the outline shape of the display panel substrate without using a photomask. Accordingly, a thin-film pattern corresponding to the desired outline shape of the display panel substrate can be formed on the substrate simply by using a single photomask for each pattern of the semiconductor element. That is, when the display panel having a different shape is to be manufactured, by implementing the second exposure step along the intended outline shape of the display panel, a substrate having no thin film in the portion along the outline can be manufactured. By cutting the substrate along the outline, a display panel substrate with the outer portion having no exposed thin film can be manufactured. Accordingly, even when the display panel substrate having a different outline shape is to be manufactured, the display panel substrate having the desired outline shape can be manufactured without an increase in the number of photomasks to be prepared, and a decrease in manufacturing cost can be achieved.

In the manufacturing method, the steps from the film forming step to the peeling step may be repeatedly performed to form a plurality of laminated thin-film patterns constituting at least the semiconductor element on the substrate. In the second exposure step that is repeatedly performed, a scan path of scanning light over the substrate may be equalized.

According to the above manufacturing method, in the second exposure step that is repeatedly performed, the scan path of the scanning light over the substrate is equalized. Accordingly, by repeatedly performing the steps from the film forming step to the peeling step, a plurality of thin-film patterns having equal outline portions can be formed on the substrate in laminate form. Accordingly, the manufacturing method, with respect to a display panel substrate having a semiconductor element including a plurality of thin-film patterns, provides a specific method for manufacturing a substrate having a desired outline shape, while achieving a decrease in manufacturing cost.

In the manufacturing method, the resist pattern formed on the thin film for forming a thin-film pattern on a relatively upper layer side may be formed using a decreased irradiation width of the light with which the resist film is scanned and irradiated in the second exposure step, compared with the resist pattern formed on the thin film for forming a thin-film pattern on a relatively lower layer side.

In the manufacturing method, if a part of the thin-film pattern formed on the lower layer side is exposed from the thin film formed on the upper layer side, the part of the thin-film pattern formed on the lower layer side could be unintentionally etched when a part of the thin film on the upper layer side is removed by etching. According to the manufacturing method, with respect to the portion irradiated with light in the second exposure step, the width of the resist film that is removed in the developing step is made smaller for the resist pattern formed on the thin film for forming the thin-film pattern on the upper layer side, compared with the resist pattern formed on the thin film for forming the thin-film pattern on the lower layer side.

As a result, in the vicinity of the portion irradiated with light in the second exposure step, the end portion of the thin-film pattern on the lower layer side is covered with the end portion of the thin-film pattern on the upper layer side. Accordingly, the part of the thin-film pattern on the lower layer side can be prevented from being unintentionally etched, and the development of a defect in the part of the thin-film pattern on the lower layer side can be suppressed. In this way, in the second exposure step that is repeatedly performed, by decreasing the irradiation width of the scanning and irradiating light, the development of a defect in a part of the thin-film pattern on the lower layer side can be suppressed without modifying the scan path of the scanning and irradiating light.

The manufacturing method may include a sealant coating step of coating a sealant on the substrate along a scan path of the scanning and irradiating light in the second exposure step.

According to this manufacturing method, a bonded substrate for use in a display panel can be manufactured by, for example, performing the sealant coating step on the display panel substrate manufactured using the above manufacturing method; separately preparing a display panel substrate having an outline shape substantially equal to that of the earlier-mentioned display panel substrate; and bonding the two display panel substrates to each other via the sealant coated. Thereafter, with respect to the bonded substrate, the liquid crystal layer is injected into a gap between the bonded substrates, for example, whereby a display panel for a liquid crystal display device having a desired outline shape can be manufactured. Alternatively, after the sealant coating step, liquid crystal may be filled into a region surrounded by the sealant, and then the separately prepared display panel substrate may be bonded via the sealant to manufacture the display panel.

Advantageous Effect of the Invention

According to the technology disclosed in the present description, a display panel substrate having a desired outline shape can be manufactured while achieving a decrease in manufacturing cost.

BEST MODE FOR CARRYING OUT THE INVENTION

First Embodiment

With reference to FIG. 1 to FIG. 15, a first embodiment will be described. In the present embodiment, an example of a method of manufacturing a liquid crystal panel 10 included in a liquid crystal display device will be described. In parts of the drawings, an X-axis, a Y-axis, and a Z-axis are shown, the direction of each axis being common throughout the drawings. In FIG. 2 and FIG. 4 to FIG. 6, the top of the drawings corresponds to the upper side (front side) of the liquid crystal panel 10.

Figure 1:
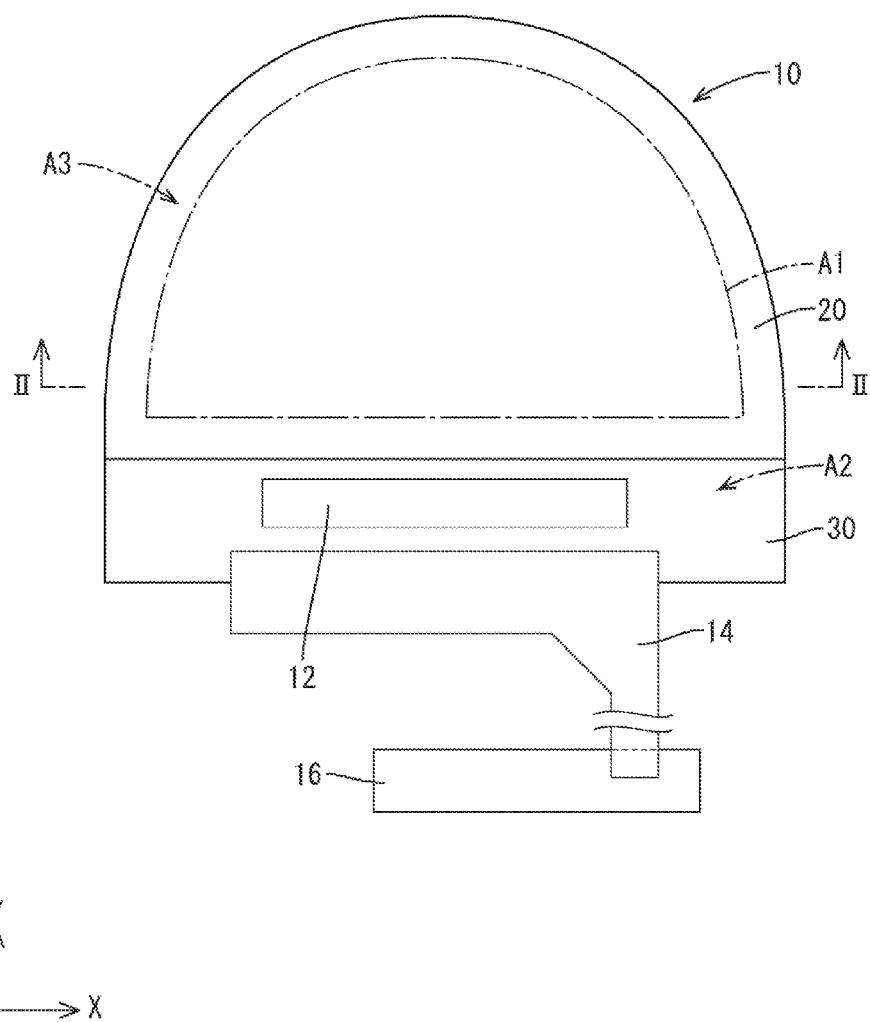
FIG. 1 is a schematic plan view of a liquid crystal panel.

First, the configuration of the liquid crystal panel 10 will be described. The liquid crystal panel 10 described by way of example in the present embodiment, as viewed in plan, has an outline shape which is not a conventional rectangular or square shape. Rather, a part of the contour line forming the outline shape is curved. Specifically, the liquid crystal panel 10, as viewed in plan in FIG. 1, has a substantially semicircular outline shape. In FIG. 1, of the contour line forming the outline shape of the liquid crystal panel 10, a linear portion extends in a direction aligned with the X-axis direction.

In the liquid crystal panel 10, a display region A1 in which an image can be displayed is disposed in a major portion of the panel, with the region outside the display region A1 forming a non-display region A2 in which no image is displayed. Of the non-display region A2, a frame-shaped region surrounding the display region A1 is a region forming a frame of the liquid crystal display device. In the following, the frame-shaped region will be referred to as a frame region A3. In a part of the non-display region A2 that is close to one edge of the liquid crystal panel 10 in the Y-axis direction (lower side in FIG. 1), an IC chip 12 and a flexible board 14 are mounted. The IC chip 12 is an electronic component for driving the liquid crystal panel 10. The flexible board 14 is a base board and connects the liquid crystal panel 10 to a control board 16 that supplies the IC chip 12 with various input signals from the outside.

Figure 2:
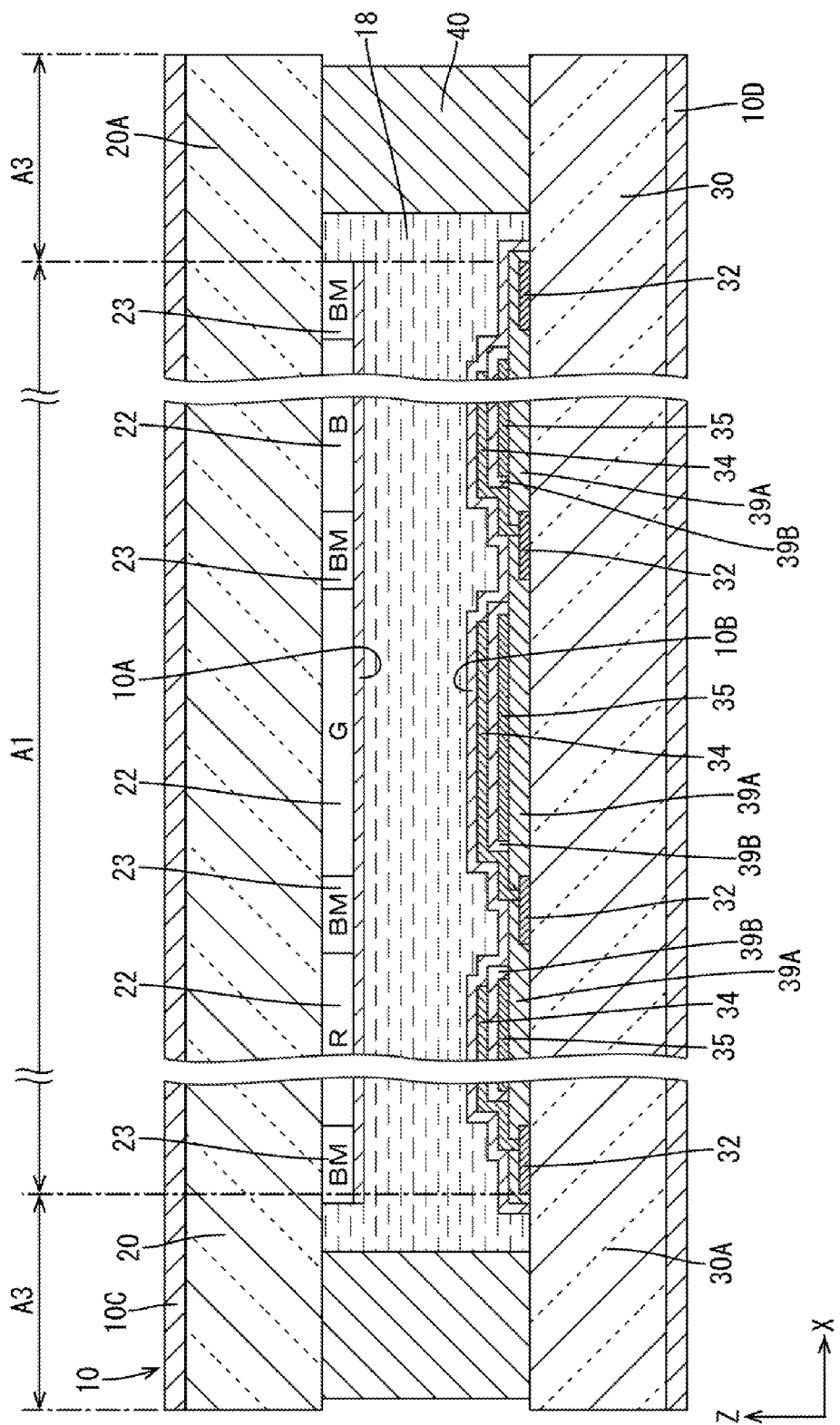
FIG. 2 is a schematic cross sectional view of the liquid crystal panel, illustrating a cross sectional configuration in a II-II cross section of FIG. 1.

The liquid crystal panel 10 is provided with, as illustrated in FIG. 1 and FIG. 2, a pair of glass substrates 20, 30 which are highly light-transmissive, and a liquid crystal layer including liquid crystal molecules that change optical characteristics thereof by application of an electric field. The substrates 20, 30 of the liquid crystal panel 10 are bonded to each other, with a cell gap corresponding to the thickness of the liquid crystal layer 18 maintained therebetween, using a sealant 40. Of the substrates 20, 30, the substrate 20 on the front side (front-face side) may be referred to as a color filter substrate 20. The substrate 30 on the back side (rear-face side) may be referred to as an array substrate (an example of a display panel substrate) 30. On the inner sides of the substrates 20, 30, alignment films 10A, 10B for aligning the liquid crystal molecules included in the liquid crystal layer 18 are respectively formed. To the outer sides of glass substrates 20A, 30A constituting the substrates 20, 30, polarization plates 10C, 10D are respectively bonded.

The glass substrate 20A constituting the color filter substrate 20 has the array substrate 30 and the polarization plate 10C bonded to major portions thereof. As illustrated in FIG. 1, the size of the color filter substrate 20 is approximately equivalent to the array substrate 30 in the X-axis direction. The size of the color filter substrate 20 in the Y-axis direction, however, is smaller than the array substrate 30, and the color filter substrate 20 is bonded to the array substrate 30 with one ends thereof in the Y-axis direction (the upper side in FIG. 1, where the contour line is curved) aligned. Accordingly, the other end (the lower side in FIG. 1) of the array substrate 30 in the Y-axis direction does not overlap the color filter substrate 20 over a predetermined range in which the upper and lower planes of the array substrate are externally exposed. In this range, a mounting region for the IC chip 12 and the flexible substrate 14 is ensured.

The glass substrate (an example of a substrate) 30A constituting the array substrate 30 has the color filter substrate 20 and the polarization plate 10D bonded thereto in major portions of the glass substrate. The portion in which the mounting region for the IC chip 12 and flexible substrate 14 is ensured is not superimposed on the color filter substrate 20 and the polarization plate 10D. The sealant 40 for bonding the substrates 20, 30 constituting the liquid crystal panel 10 is disposed, in the portion where the substrates 20, 30 are overlapped with each other, and in the frame region A3 (see FIG. 2) along the outline of the color filter substrate 20 so as to surround the display region A1 (in a substantially semicircular shape in plan view).

Figure 3:
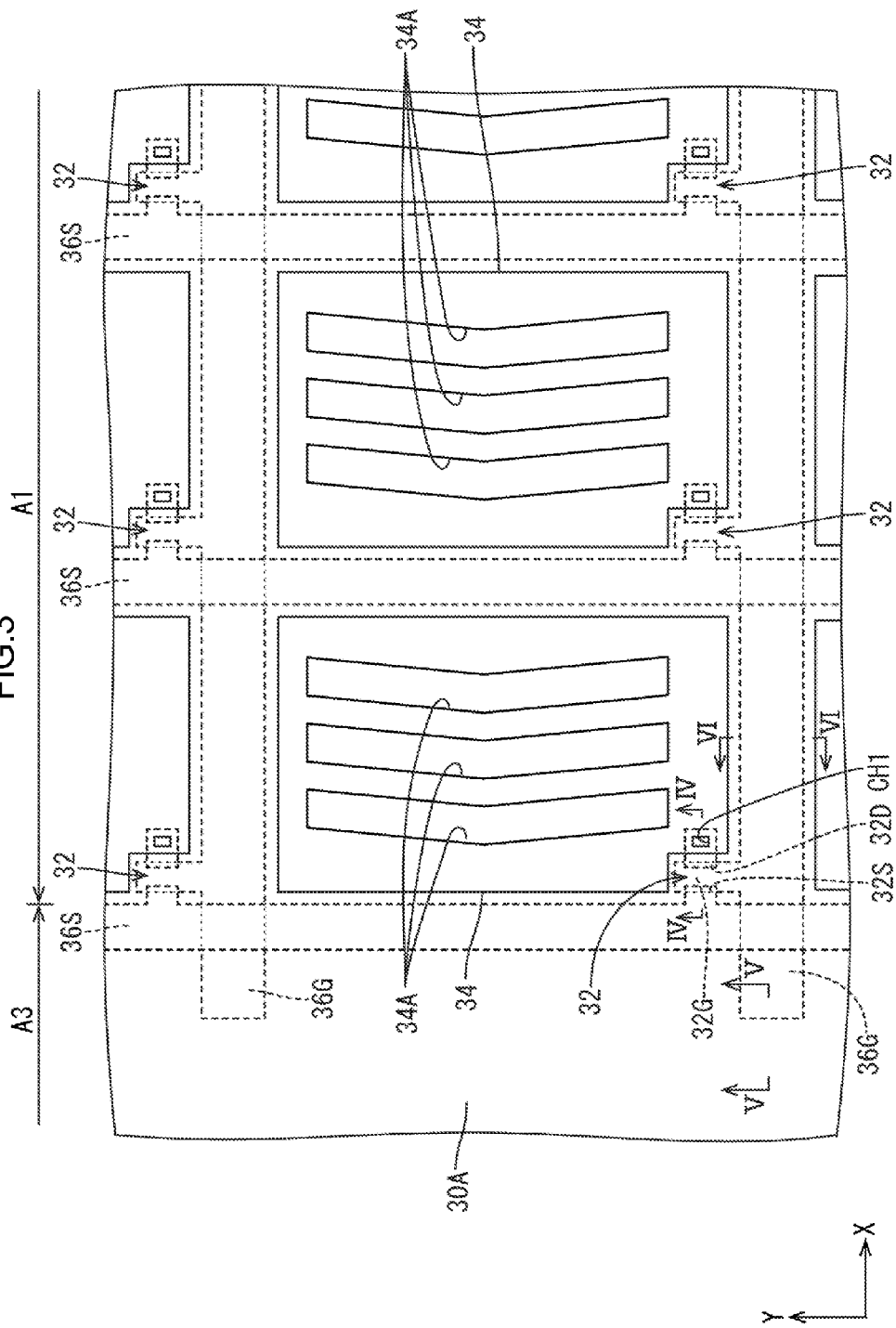
FIG. 3 is a plan view illustrating a plane configuration of a boundary portion between a display region and a frame region of an array substrate constituting the liquid crystal panel.

The configurations of the array substrate 30 and the color filter substrate 20 in the display region A1 will be next described. The liquid crystal panel 10 according to the present embodiment is operated with Fringe Field Switching (FFS) operation system. In FFS operation system, as illustrated in FIG. 3, pixel electrodes 34 and a common electrode 35 are both formed on the side of the array substrate 30 of the pair of substrates 20, 30. The pixel electrodes 34 and the common electrode 35 are disposed in different layers with an insulating film (a second protection film 39B which will be described later) interposed therebetween. The pixel electrodes 34 and the common electrode 35 are both made of transparent electrode film including transparent electrode material. The present embodiment is configured such that, of the pixel electrodes 34 and the common electrode 35, the pixel electrodes 34 are arranged on a relatively upper side, and the common electrode 35 is arranged on a relatively lower side.

Figure 4:
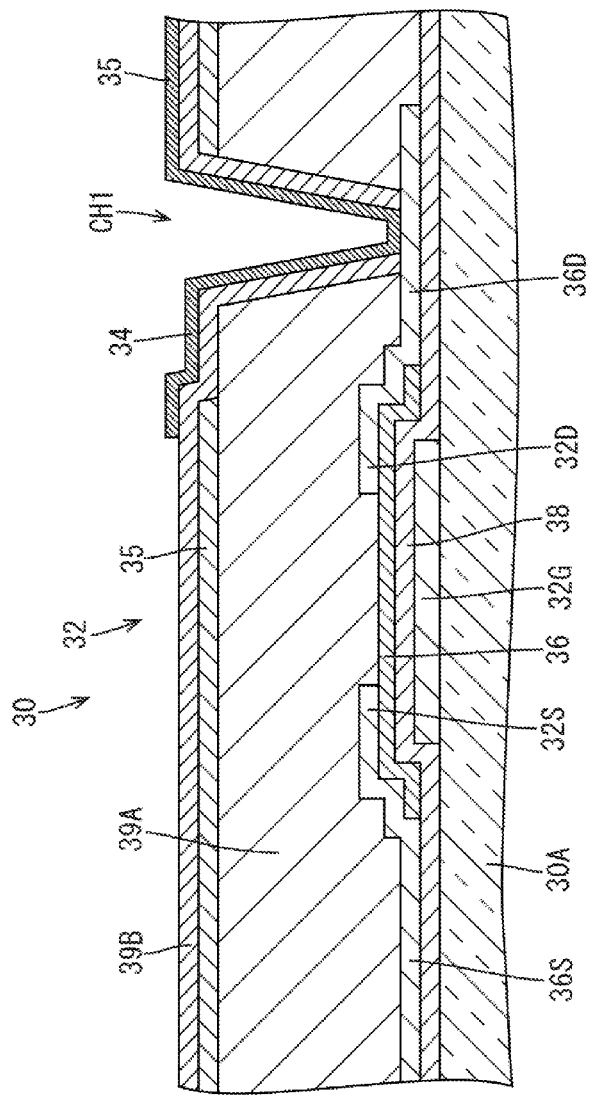
FIG. 4 is a cross sectional view in the vicinity of a TFT, illustrating a cross sectional configuration in a IV-IV cross section of FIG. 3.

In the display region A1 of the liquid crystal panel 10, a plurality of laminated thin-film patterns is formed on the inner side (the side of the liquid crystal layer 18) of the glass substrate 30A constituting the array substrate 30. Specifically, on the inner side of the glass substrate 30A constituting the array substrate 30, as illustrated in FIG. 3 and FIG. 4, a number of TFTs (examples of a semiconductor element) 32 serving as switching elements having three electrodes 32G, 32S, and 32D, and a number of pixel electrodes 34 are arranged in a matrix. The pixel electrodes 34 are made of transparent conductive film of ITO (Indium Tin Oxide) and the like and connected to the drain electrode 32D of the TFTs 32 as will be described later, On the other hand, in the non-display region A2 of the liquid crystal panel 11, common electrode wiring, which is not illustrated, is disposed on the array substrate 30. The common electrode wiring is connected to the common electrode 35 via contact holes, which are not illustrated.

As illustrated in FIG. 3, gate wiring 36G and source wiring 36S are disposed around the TFTs 32 and the pixel electrodes 34 on the array substrate 30 to surround them. The gate wiring 36G extends in the X-axis direction, and the source wiring 36S extends in the Y-axis direction, so that the wirings 36G, 36S are perpendicular to each other. As illustrated in FIG. 3, the pixel electrodes 34 are provided in substantially the entire area surrounded by the gate wiring 36G and the source wiring 36S, forming a rectangle vertically long in plan view. On the other hand, the common electrode 35 is formed as a solid pattern ranging over a plurality of pixel electrodes 34 on the upper layer side than the pixel electrodes 34. In the part of the pixel electrodes 34 surrounded by the gate wiring 36G and the source wiring 36S, three openings (hereafter referred to as "slit opening portions 34A") that have the shape of a slightly bent and vertically long slit are formed. The three slit opening portions 34A are formed for each pixel and extend along the source wiring 36S and are arranged at predetermined intervals. The function of the slit opening portions 34A will be described in detail later.

The array substrate 30 is also provided with capacitance wiring (not illustrated) which is in parallel with the gate wiring 36G and superimposed with respect to the pixel electrodes 34 as viewed in plan. The capacitance wiring is disposed alternately with the gate wiring 36G with respect to the Y-axis direction. The gate wiring 36G is disposed between the pixel electrodes 34 that are adjacent to each other in the Y-axis direction, whereas the capacitance wiring is disposed in a position cutting across approximately the center of the pixel electrodes 34 in the Y-axis direction. In the end portion of the array substrate 30, terminal portions routed around from the gate wiring 36G and capacitance wiring, and a terminal portion routed around from the source wiring 36S are provided. To the terminal portions, respective signals or reference potentials are input from the control substrate 16 illustrated in FIG. 1 so as to control the driving of the TFTs 32.

On the other hand, on the inner side (the side of the liquid crystal layer 18) of the glass substrate 20A constituting the color filter substrate 20, as illustrated in FIG. 2, a number of color filters 22 arranged in a matrix are provided to be superimposed on the respective pixel electrodes 34 of the array substrate 30, as viewed in plan. The color filters 22 include colored portions of R (red), G (green), B (blue) and the like. Light blocking portions (a black matrix) 23 are formed between the colored portions of the color filters 22 in substantially a grid to restrict colors from mixing. The light blocking portions 23 are arranged so as to be superimposed on the gate wiring 36G, source wiring 36S, and capacitance wiring provided on the array substrate 30, as viewed in plan.

In the liquid crystal panel 10, one display pixel as a unit of display is configured by a set of the colored portions of the three colored portions of R (red), G (green), and B (blue), and the three pixel electrodes 34 opposing to the colored portions. The display pixel includes a red pixel having an R colored portion, a green pixel having a G colored portion, and a blue pixel having a B colored portion. The pixels for the respective colors are disposed repeatedly e along the row-direction (X-axis direction) on the plane of the liquid crystal panel 10, whereby a pixel group is configured. A number of pixel groups are disposed side by side along the column-direction (Y-axis direction).

The TFTs 32 serving as switching elements provided on the array substrate 30 will be described in detail. As illustrated in FIG. 4, the TFT 32 is laminated on the upper layer side from the gate electrode 32G formed in a part of the gate wiring 36G. The gate wiring 36G branches from the vicinity of a part intersecting with the source wiring 36S and extends in parallel with the source wiring 36S. The source wiring 36S also branches from the vicinity of a part intersecting with the gate wiring 36G and extends in parallel with the gate wiring 36G. The tip-end portion branching and extending from the gate wiring 36G and the tip-end portion branching and extending from the source wiring 36S are superimposed on each other in plan view. The TFT 32 is provided in the superimposed part.

Of the gate wiring 36G, the part superimposed on the TFT 32 in plan view constitutes the gate electrode 32G of the TFT 32. Of the source wiring 36S, the part superimposed on the gate electrode 32G in plan view constitutes the source electrode 32S of the TFT 32. The TFT 32 also includes the drain electrode 32D which has an island shape formed by being disposed so as to oppose, via a predetermined interval, the source electrode 32S with respect to the X-axis direction. The source electrode 32S and the drain electrode 32D are formed from the same material as the source wiring 36S, and patterned on the array substrate 30 in the same step as for the source wiring 36S.

In the TFT 32, on the upper layer side of the gate electrode 32G, a semiconductor film 36 is formed so as to bridge the source electrode 32S and the drain electrode 32D. The source electrode 32S and the drain electrode 32D are disposed to oppose each other across a predetermined interval, and are not directly electrically connected to each other. The source electrode 32S and the drain electrode 32D are electrically connected to each other indirectly via the semiconductor film 36 on the lower layer side. The bridge portion between the electrodes 32S, 32D of the semiconductor film 36 functions as the channel region through which drain current flows.

In addition, on the array substrate 30, various insulating films including a gate insulating film 38, a first protection film 39A, and a second protection film 39B are laminated in this order from the lower layer side (the side of the glass substrate 30A). The gate insulating film 38 is laminated on the upper layer side of at least the gate wiring 36G and the gate electrode 32G, and is made of transparent inorganic material. The first protection film 39A is disposed on the upper layer side of at least the source electrode 32S and the drain electrode 32D. The second protection film 39B is disposed on the upper layer side of the first protection film 39A. The first protection film 39A and the second protection film 39B are both made of transparent inorganic material. The gate wiring 36G, source wiring 36S, capacitance wiring, semiconductor film 36, and various insulating films 38, 39A, and 39B formed on the glass substrate 30A are examples of a thin-film pattern.

In the first protection film 39A and the second protection film 39B, a contact hole CH1 is formed vertically therethrough, in a position superimposed on a part of the drain electrode 32D in plan view (see FIG. 3 and FIG. 4), whereby the drain electrode 32D is exposed in the opening of the contact hole CH1. The pixel electrode 34 is formed in a part of the second protection film 39B on the upper layer side thereof so as to straddle the contact hole CH1. Through the contact hole CH1, the pixel electrode 34 is connected to the drain electrode 32D. Since the pixel electrode 34 is connected to the drain electrode 32D, when the gate electrode 32G of the TFT 32 is energized (the TFT 32 is turned on), current flows between the source electrode 32S and the drain electrode 32D via the channel region, and a predetermined voltage is applied to the pixel electrode 34.

To the common electrode 35, a reference potential is applied from the common electrode wiring. By controlling the potential applied to the pixel electrode 34 from the TFT 32, a predetermined potential difference can be caused between the pixel electrode 34 and the common electrode 35. If a potential difference is caused between the pixel electrode 34 and the common electrode 35, a fringe electric field (oblique electric field) is applied to the liquid crystal layer 18 which includes a component in a direction perpendicular to the plane of the array substrate 30, in addition to a component along the plane of the array substrate 30, due to the slit opening portions 34A of the pixel electrode 34. In this way, among the liquid crystal molecules included in the liquid crystal layer 18, those existing above the common electrode 35, in addition to those existing above the slit opening portions 34A, can have their alignment state properly switched. Accordingly, the opening rate of the liquid crystal panel 10 is increased, a sufficient light transmission amount can be obtained, and high view angle performance can be obtained.

The TFTs 32 and the material of the various thin films formed in the vicinity of the TFTs 32 will be described. The gate wiring 36G and the gate electrode 32G are patterned on the array substrate 30, and made of a metal laminate film in which metal films of tungsten (W), silicon nitride (SiNx) and the like are laminated. The source wiring 36S, source electrode 32S, and drain electrode 32D are configured of the same material, and each is a metal laminate film of triple-layer structure. The source wiring 36S, source electrode 32S, and drain electrode 32D have a configuration in which a layer of titanium (Ti), a layer of aluminum (Al), and a layer of titanium are laminated in order from the lower layer side.

The gate insulating film 38 is made of silicon oxide film (SiOx), for example, and provides insulation between the gate electrode 32G and the semiconductor film 36. The first protection film 39A is made of, e.g., silicon oxide film (SiOx), i.e., the same material as the gate insulating film 38. The second protection film 39B is made of organic material, such as acrylic resin (for example, polymethylmethacrylate resin (PMMA)) or polyimide resin. Accordingly, the second protection film 39B has a large film thickness compared with the other films made of inorganic material, such as the gate insulating film 38 and the first protection film 39A, and functions as a planarization film. Each of the insulating films of the TFTs 32 (gate insulating film 38, first protection film 39A, and second protection film 39B) is formed with a uniform film thickness generally throughout the entire area in the array substrate 30, including regions other than the region in which the TFT 32 is formed.

The semiconductor film 36 is made of an oxide semiconductor. A specific example of the oxide semiconductor forming the semiconductor film 36 is a transparent In—Ga—Zn—O-based semiconductor including indium (In), gallium (Ga), zinc (Zn), and oxide (O) (indium-gallium-zinc oxide). The In—Ga—Zn—O-based semiconductor is a ternary oxide of In (indium), Ga (gallium), and Zn (zinc), where the ratio (composition ratio) of In, Ga, and Zn is not particularly limited and includes, for example, In:Ga:Zn=2:2:1, In:Ga:Zn=1:1:1, and In:Ga:Zn=1:1:2. The oxide semiconductor forming the semiconductor film 36 (In—Ga—Zn—O-based semiconductor) may be amorphous; preferably, however, the oxide semiconductor includes a crystalline portion and has crystallinity. A preferable example of the oxide semiconductor having crystallinity is a crystalline In—Ga—Zn—O-based semiconductor in which c-axis is aligned generally perpendicular to the layer face. The crystal structure of such an oxide semiconductor (In—Ga—Zn—O-based semiconductor) is disclosed in Japanese Unexamined Patent Publication No. 2012-134475, for example. For reference, the entire contents of the disclosure of Japanese Unexamined Patent Publication No. 2012-134475 are incorporated into the present description.

The semiconductor film 36 has high electron mobility 20 to 50 times that of amorphous silicon thin films and the like, for example, so that the size of the TFTs 32 can be easily decreased, and the light transmission amount of the pixel electrodes 34 can be maximized. This is preferable in increasing the resolution of the liquid crystal panel 10 and reducing power consumption of the backlight device that supplies light to the liquid crystal panel 10. In addition, by selecting an oxide semiconductor as the material of the channel region of the TFTs 32, compared with the case where amorphous silicon is used as the material of the channel region, for example, the off-characteristics of the TFTs 32 are increased and the off-leak current becomes extremely small, such as on the order of one hundredth. Accordingly, the voltage retention of the pixel electrodes 34 becomes high, which is preferable in reducing power consumption of the liquid crystal panel 10. The TFTs 32 including such a channel region are of a so-called inversely staggered type in which the gate electrode 32G is disposed on the lowermost layer, with the channel region laminated on the upper layer side of the gate electrode via the gate insulating film 38. The laminate structure is similar to that of conventional TFTs having an amorphous silicon thin film.

Figure 5:
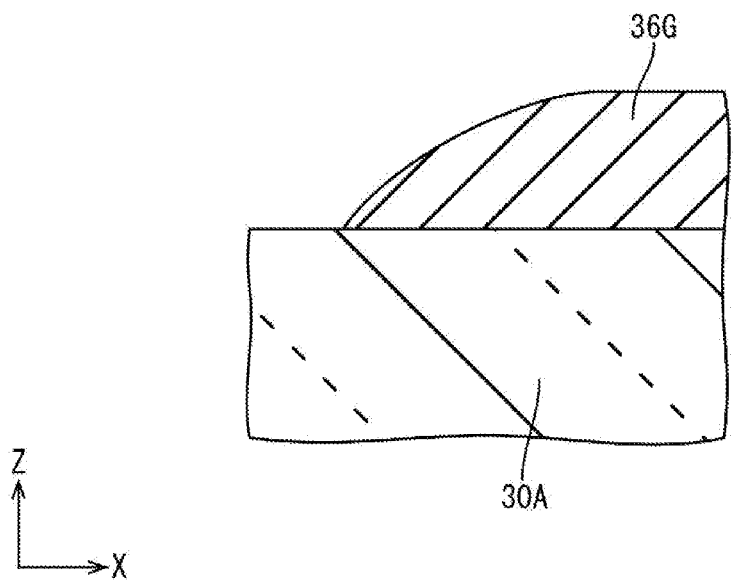
FIG. 5 is a cross sectional view of an end portion facing a frame region side of a gate wiring, illustrating a cross sectional configuration in a V-V cross section of FIG. 3.
Figure 6:
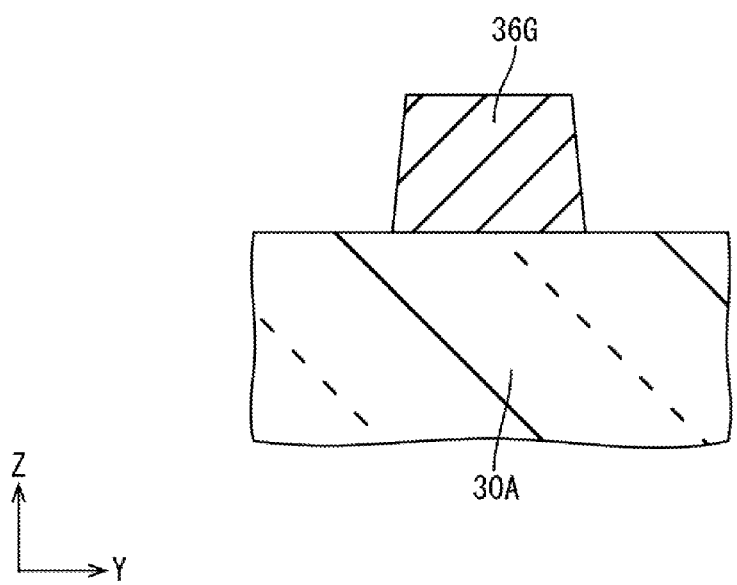
FIG. 6 is a cross sectional view of an end portion facing a display region side of the gate wiring, illustrating a cross sectional configuration in a VI-VI cross section of FIG. 3.

With reference to the gate wiring 36G formed on the array substrate 30, differences between the gate wiring 36G formed in the display region A1 and the gate wiring 36G formed in the vicinity of the display region A1 and frame region A3 will be described. In the vicinity of the display region A1 and frame region A3, the end portion of the gate wiring 36G facing the frame region A3 (the end portion with respect to the X-axis direction in FIG. 3) is tapered with a gradual inclination angle, as illustrated in FIG. 5. On the other hand, as illustrated in FIG. 6, in the display region A1, the end portion of the gate wiring 36G (the end portion with respect to the Y-axis direction in FIG. 3) is tapered with a steep inclination angle compared with the end portion of the gate wiring 36G illustrated in FIG. 5.

Figure 7:
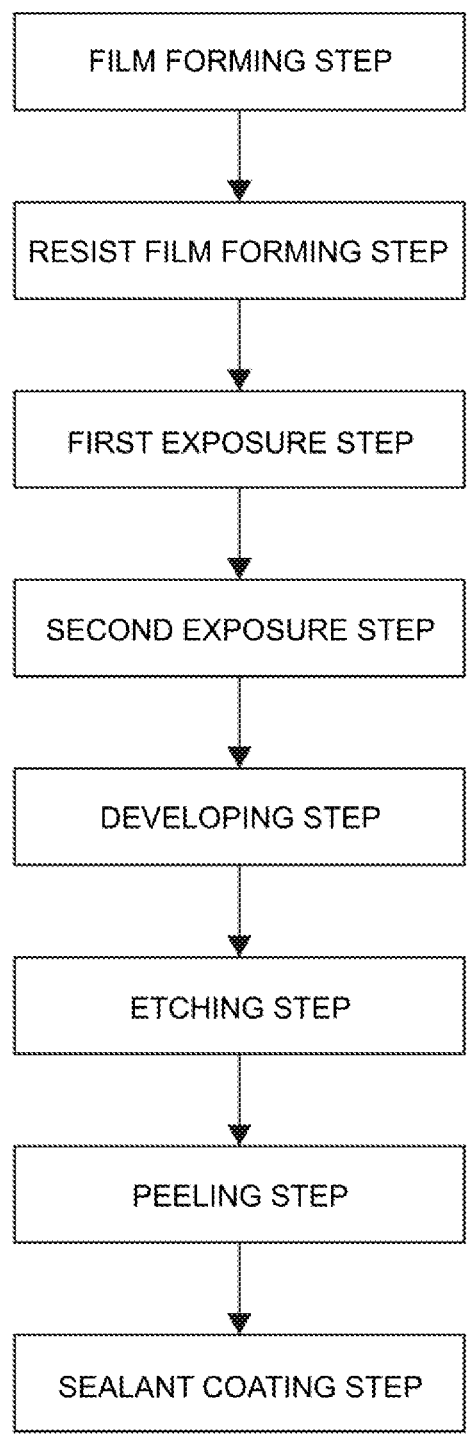
FIG. 7 is a flowchart for describing an array substrate manufacturing procedure.

The configuration of the liquid crystal panel 10 according to the present embodiment has been described. Next, a method for manufacturing the liquid crystal panel 10 having the configuration will be described. In the following, a method for manufacturing the array substrate 30 in particular will be described in detail. Initially, the method of manufacturing the array substrate 30 will be described. The method of manufacturing the array substrate 30 includes, as shown in FIG. 7, a film forming step, a resist forming step, a first exposure step, a second exposure step, a developing step, an etching step, a peeling step, and a sealant coating step. The steps are performed in the order mentioned. In the manufacturing process of manufacturing the array substrate 30, among the steps shown in FIG. 7, the steps other than the sealant coating step, i.e. from the film forming step to the resist peeling step are repeatedly performed, whereby a plurality of thin-film patterns are laminated and formed on the glass substrate 30A constituting the array substrate 30.

Figure 8:
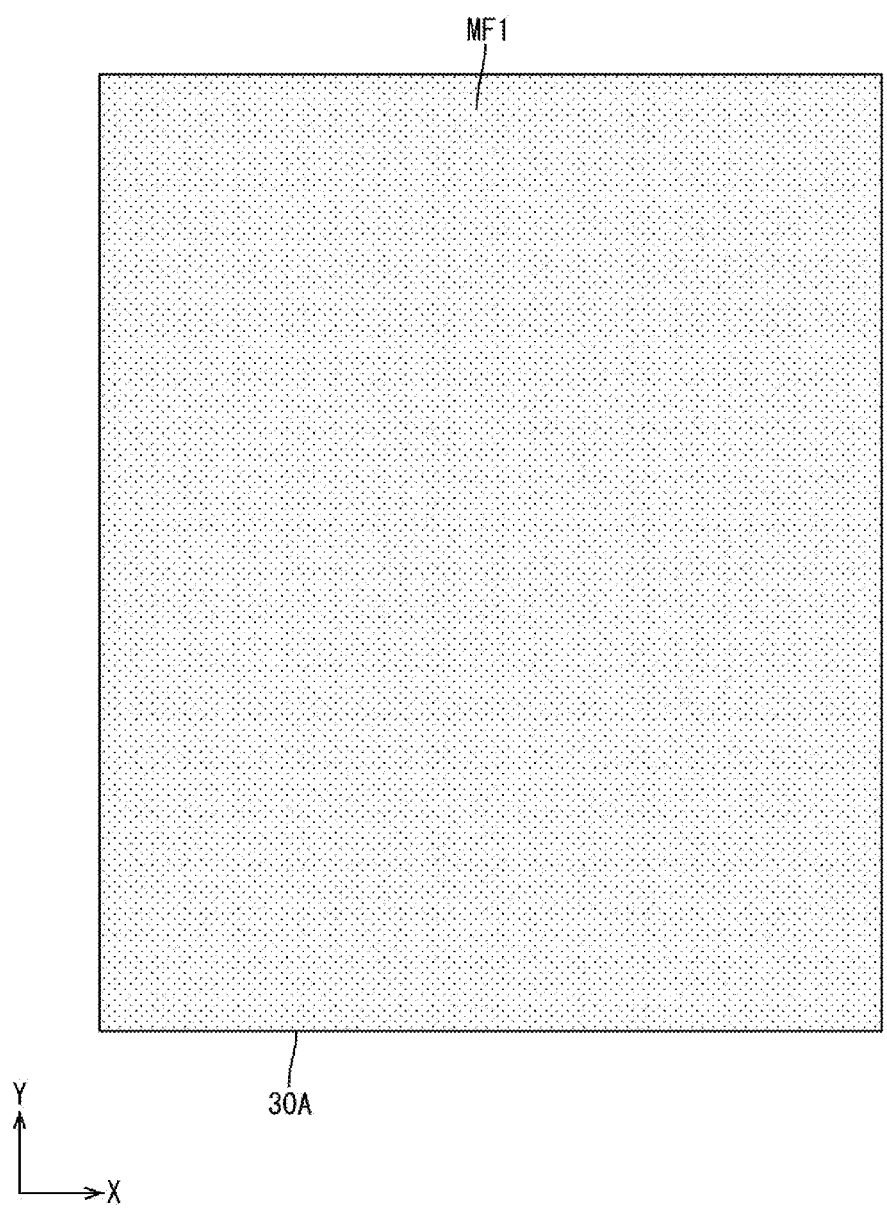
FIG. 8 is a plan view illustrating an array substrate manufacturing step (1).
Figure 9:
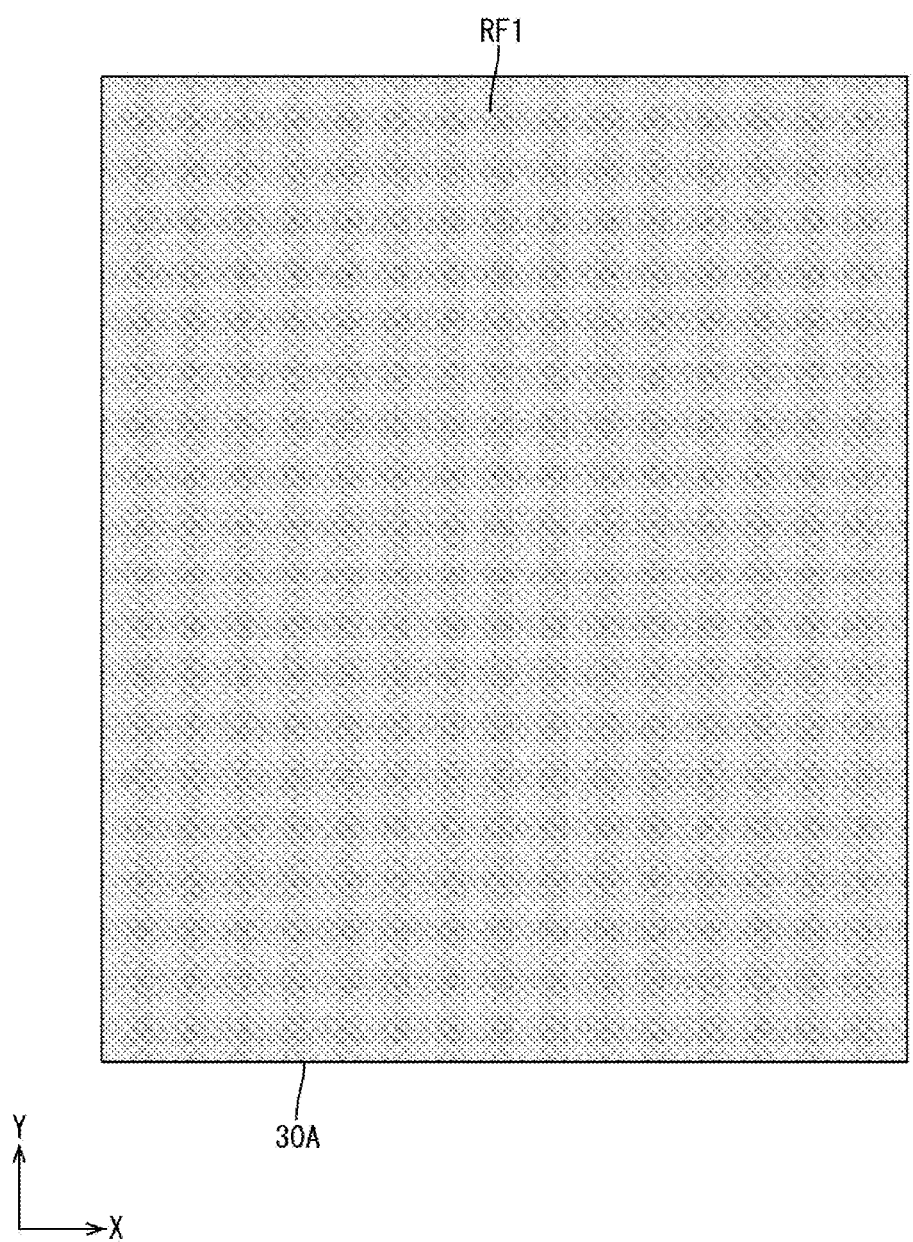
FIG. 9 is a plan view illustrating an array substrate manufacturing step (2).
Figure 10:
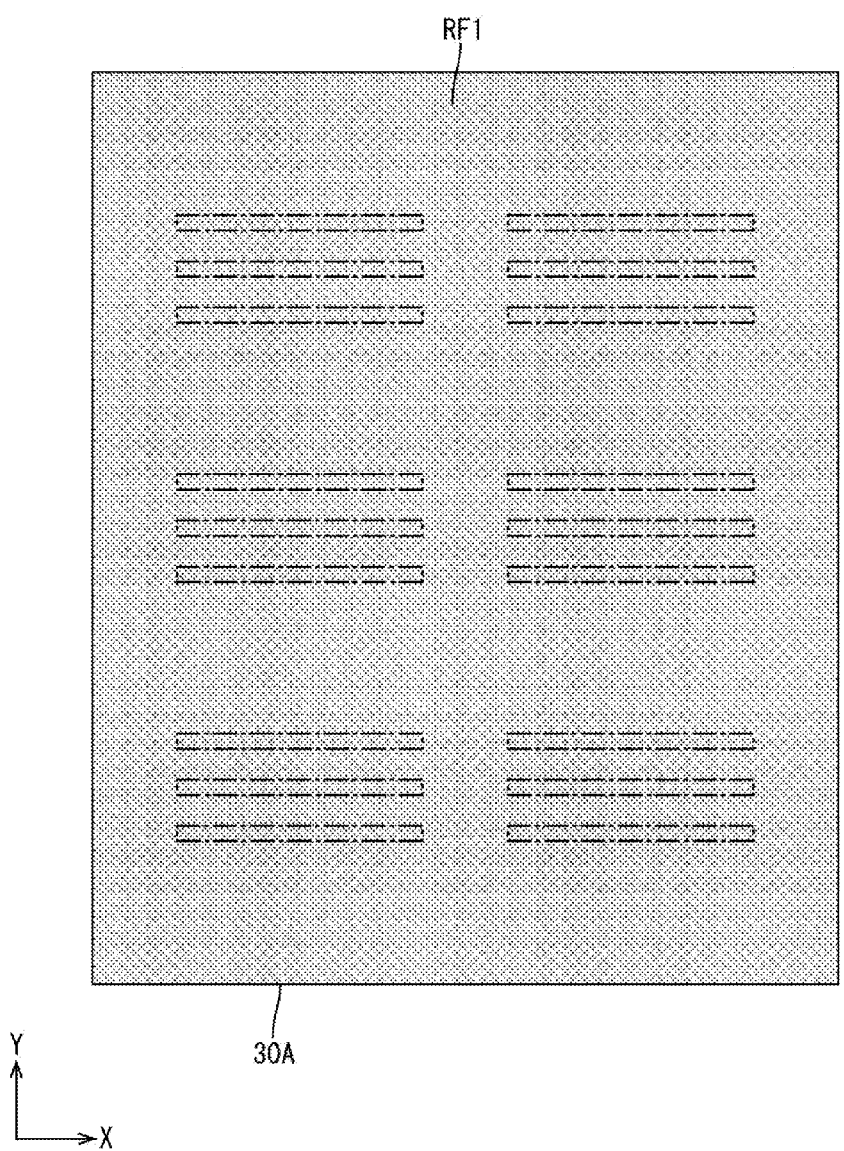
FIG. 10 is a plan view illustrating an array substrate manufacturing step (3).

In the manufacturing method according to the present embodiment, a single sheet of the glass substrate 30A is cut in a step which will be described below, whereby six liquid crystal panels 10 are manufactured from the single sheet of glass substrate 30A. Specifically, at each of six locations on the glass substrate 30A (hereafter referred to as "the six locations"), a plurality of laminated thin-film patterns constituting the array substrate 30 is formed. In the manufacturing step for the array substrate 30 according to the present embodiment, initially, as illustrated in FIG. 8, a metal laminate film (an example of thin film) MF1 constituting the gate wiring 36G and the gate electrode 32G is formed (film forming step) throughout the entire area on the glass substrate 30A. Next, as illustrated in FIG. 9, throughout the entire area on the metal laminate film MF1 formed, a positive resist film RF1 is coated, forming the resist film RF1 on the metal laminate film MF1 (resist film forming step).

Then, a photomask having a pattern that is light-shielded in portions corresponding to the patterns of the gate wiring 36G and gate electrode 32G to be formed is prepared, and the resist film RF1 is partially selectively exposed via the photomask (first exposure step). As a result, the photomask pattern is transferred onto the resist film RF1 formed on the metal laminate film MF1. That is, as illustrated schematically in FIG. 10, of the resist film RF1, portions except for the portions corresponding to the patterns of the gate wiring 36G and gate electrode 32G to be formed (the portions enclosed by dot-and-dash lines and extending along the X-axis direction in FIG. 10) are exposed. In practice, the respective thin-film patterns TP1 (see FIG. 13) of the gate wiring 36G and gate electrode 32G formed on the resist film RF1, and the respective resist patterns RP1 (see FIG. 12) corresponding to the thin-film patterns TP1 are formed in large numbers (for example, several thousands) along the X-axis direction in accordance with the number of pixels. However, in FIG. 10 to FIG. 15, for brevity of description, the thin-film patterns TP1 and the resist patterns RP1 formed in the six locations on the glass substrate 30A are illustrated using three patterns each.

Figure 11:
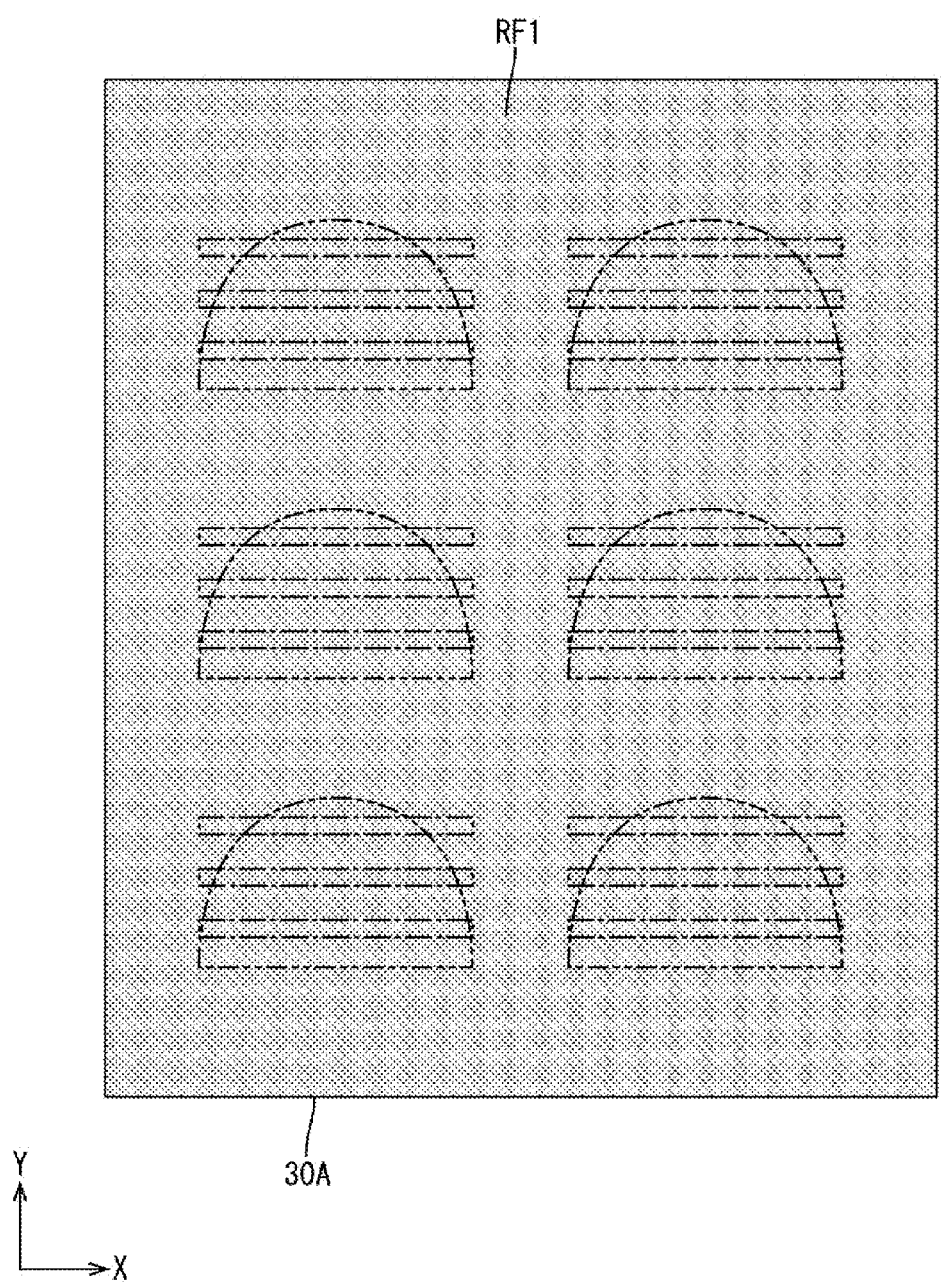
FIG. 11 is a plan view illustrating an array substrate manufacturing step (4).

Then, the six locations on the resist film RF1 are scanned and irradiated with light along the outline shape (substantially semicircular shape) of the array substrate 30, whereby the resist film RF1 is partially selectively exposed (second exposure step). Specifically, in the second exposure step, the resist film RF1 is irradiated with ultraviolet laser along the outline shape of the array substrate 30 without using a photomask. The ultraviolet laser has an irradiation width of 0.5 mm to 10 mm, preferably 1 mm to 5 mm. In the second exposure step, the resist film RF1 is selectively exposed by scanning the resist film RF1 with ultraviolet laser in the irradiation width once. In FIG. 11, the scan path (substantially semicircular scan path) of the irradiating light in the second exposure step is indicated with two-dot chain lines. As illustrated in FIG. 11, the scan path of the irradiating light in the second exposure step is partially superimposed on the portions of the resist film RF1 that have not been exposed in the first exposure step (portions enclosed by dot-and-dash lines in FIG. 10 and FIG. 11).

Figure 12:
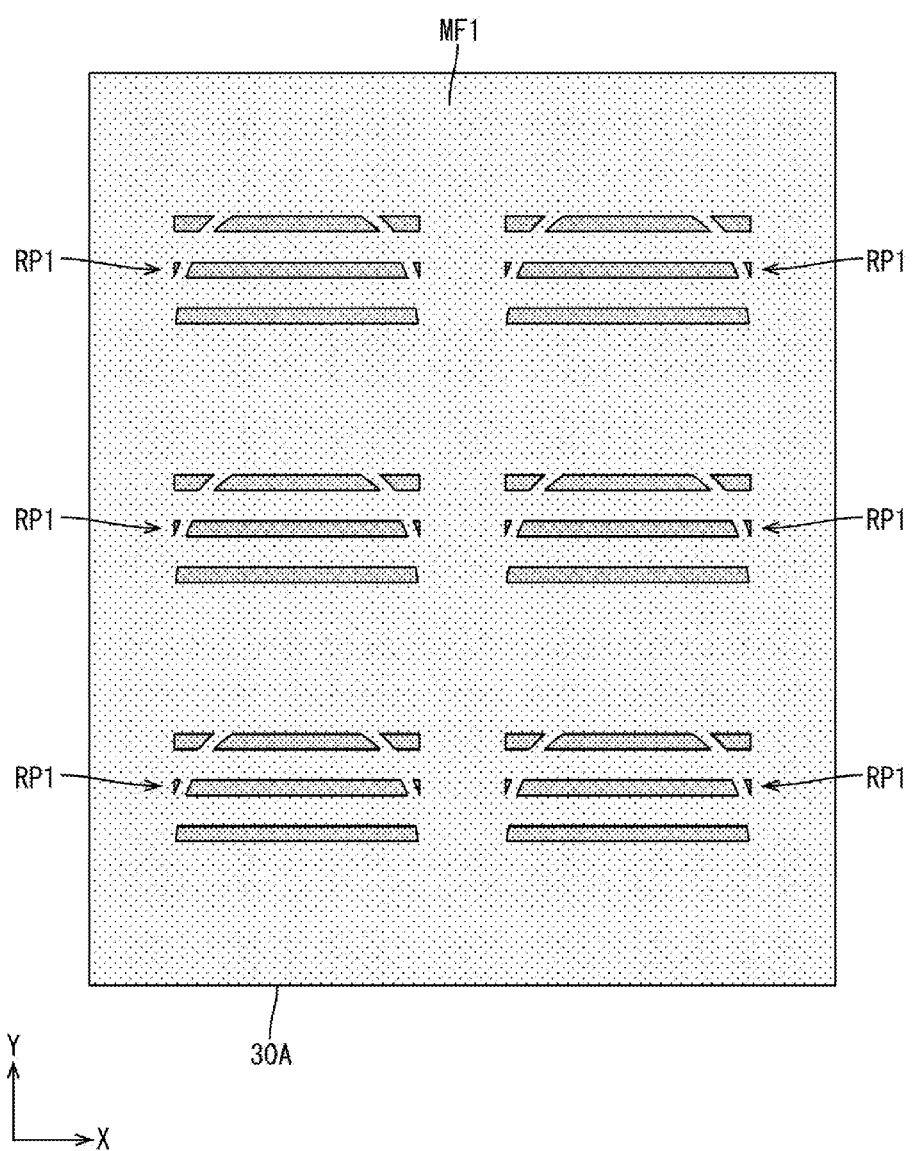
FIG. 12 is a plan view illustrating an array substrate manufacturing step (5).

The glass substrate 30A is then immersed in developing fluid, such as a Tetra Methyl Ammonium Hydroxide (TMAH) aqueous solution, to develop the resist film RF1 (developing step). As a result, as illustrated in FIG. 12, of the resist film RF1, the portions irradiated with light in the first exposure step and the second exposure step are removed, and the portions that were not irradiated with light remain. Accordingly, the resist patterns RP1 are formed in the six locations on the metal laminate film MF1.

After the developing step, a cleaning step of cleaning the glass substrate 30A using a cleaning fluid, such as ultrapure water, may be performed. In this way, of the resist film RF1, the portions irradiated with light in the first exposure step and the second exposure step can be removed with high accuracy. After the cleaning step, a post-bake step of heating the glass substrate 30A may be performed. In this way, the cleaning fluid that has become attached onto the metal laminate film MF1 and resist patterns RP1 in the cleaning step can be removed, and the adhesion between the resist patterns RP1 and the metal laminate film MF1 can be increased.

Figure 13:
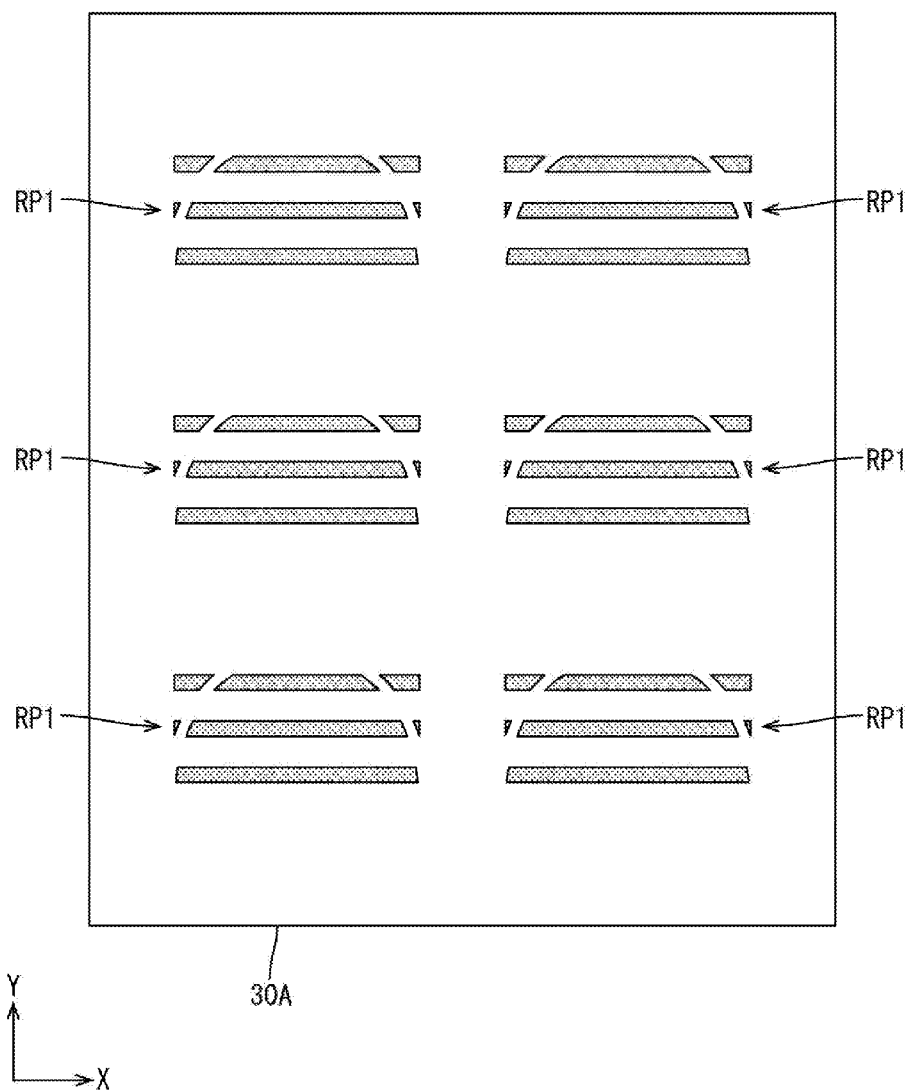
FIG. 13 is a plan view illustrating an array substrate manufacturing step (6).
Figure 14:
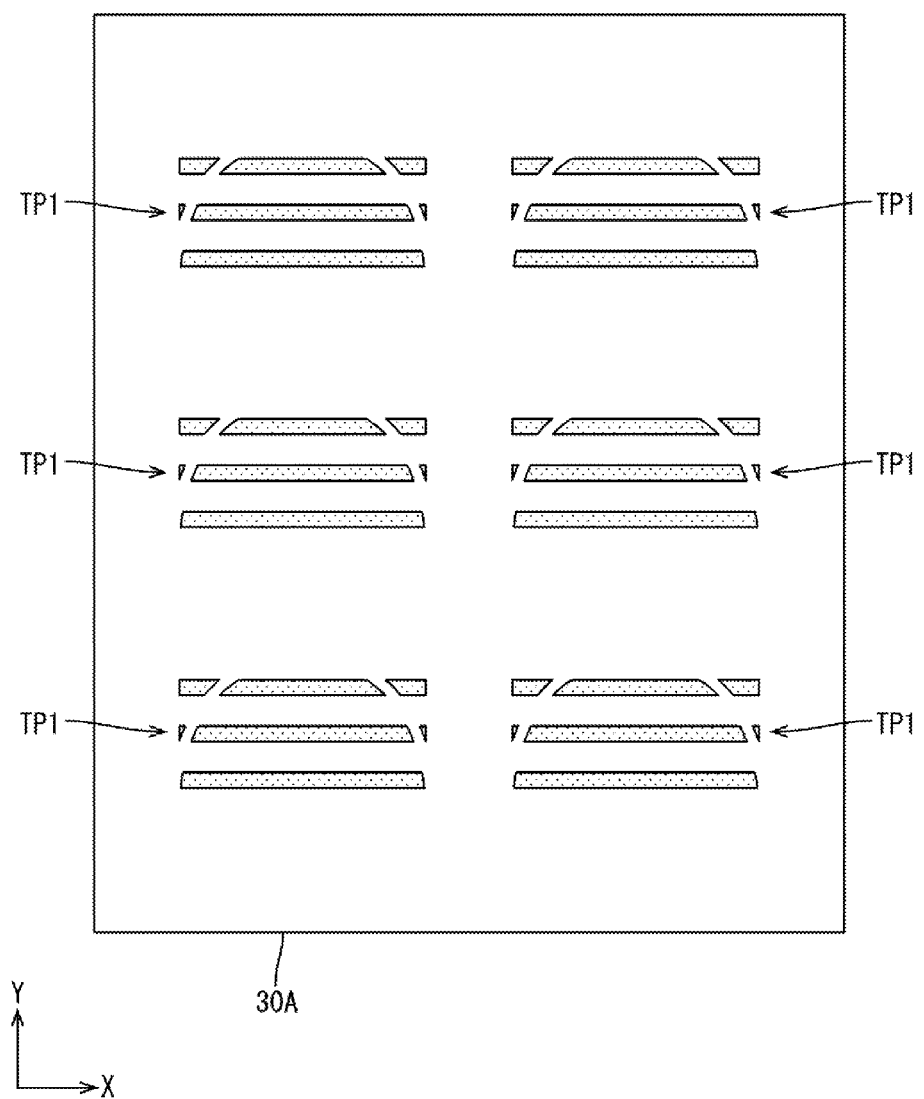
FIG. 14 is a plan view illustrating an array substrate manufacturing step (7).

Then, using the resist patterns RP1 formed on the metal laminate film MF1 as a mask, the metal laminate film MF1 is etched to partially remove the metal laminate film MF1 (etching step). The method of etching the metal laminate film MF1 is not limited. In this way, as illustrated in FIG. 13, of the metal laminate film MF1, the portions that are not superimposed on the resist patterns RP1 are removed, and thin-film patterns TP1 (see FIG. 14) having the same pattern shape as the resist patterns RP1 are formed. Then, the resist patterns RP1 are peeled from the thin-film patterns TP1 (peeling step). Specifically, the resist patterns RP1 are peeled using peeling fluid, such as organic solvent. In this way, as illustrated in FIG. 14, the thin-film patterns TP1 are exposed on the glass substrate 30A. Through the above steps, the thin-film patterns TP1 of the gate wiring 36G and gate electrode 32G are formed on the glass substrate 30A.

Next, with respect to the inorganic material constituting the gate insulating film 38, the steps are performed sequentially from the film forming step to the peeling step, whereby a thin-film pattern of the gate insulating film 38 is formed on the thin-film patterns TP1 of the gate wiring 36G and gate electrode 32G. Thereafter, using the same procedure as the procedure for forming the thin-film patterns TP1, the steps are performed sequentially from the film forming step to the peeling step from the lower layer side, with respect to the various thin films formed on the upper layer side of the gate insulating film 38. The various thin films include the oxide semiconductor constituting the semiconductor film 36, the metal laminate films constituting the capacitance wiring, source wiring 36S, source electrode 32S, and drain electrode 32D, the silicon oxide film constituting the first protection film 39A, the transparent electrode film constituting the common electrode 35, the acrylic resin film constituting the second protection film 39B, and the transparent electrode film constituting the pixel electrodes 34. In this way, on the thin-film patterns of the gate insulating film 38, the thin-film patterns for the various thin films are laminated and formed in order.

Since the various thin-film patterns have respectively different pattern shapes, in the manufacturing process of the various thin-film patterns, during the first exposure step that is repeatedly performed, a different single sheet of photomask is used. In addition, in the manufacturing process for the various thin-film patterns, during the second exposure step that is repeatedly performed, the scan path of the scanning light over the glass substrate 30A is equalized. In this way, the outline portions of the various thin-film patterns formed on the glass substrate 30A are equalized. That is, with respect to all of the thin-film patterns formed on the glass substrate 30A, the portions along the outline shape of the array substrate 30 are removed in the etching step.

Figure 15:
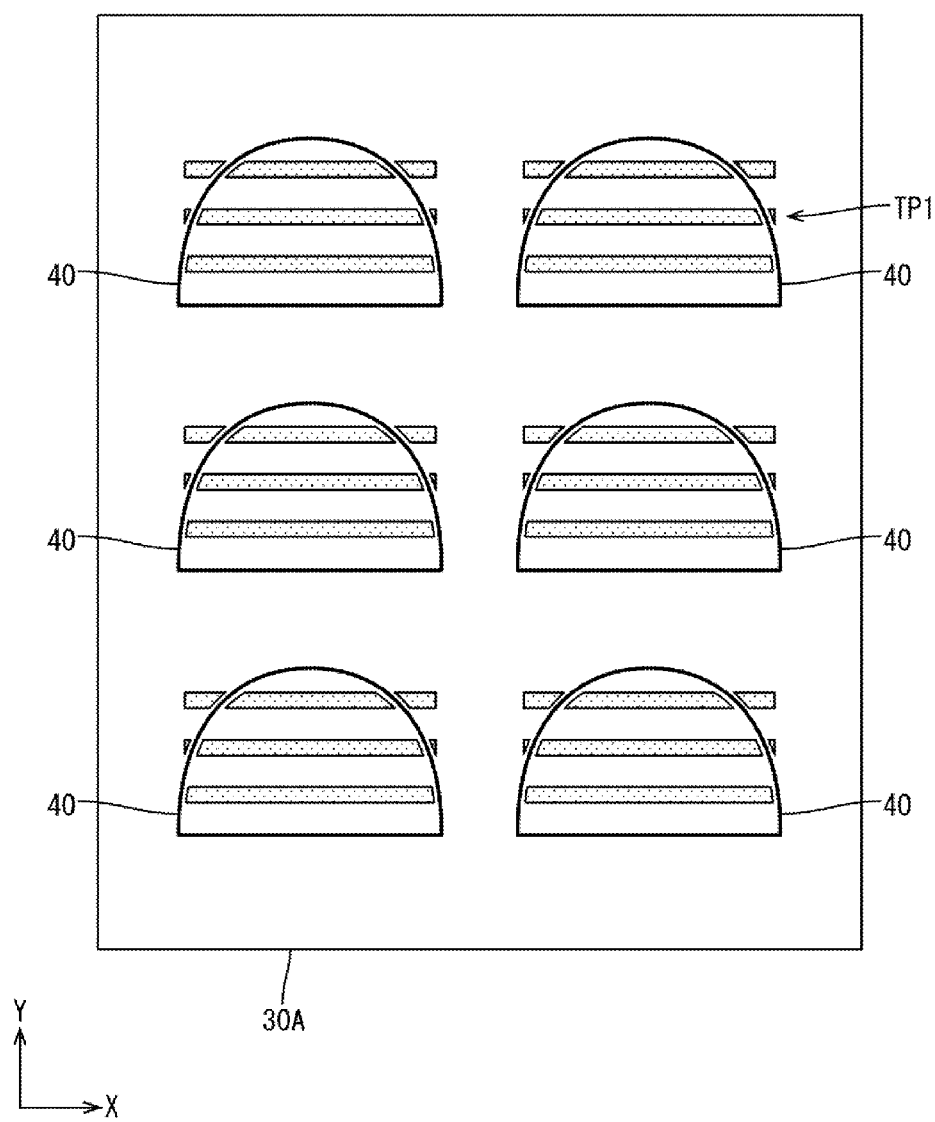
FIG. 15 is a plan view illustrating an array substrate manufacturing step (8).

After all of the thin-film patterns constituting the array substrate 30 are formed on the glass substrate 30A by the above procedure, an alignment film 10B is formed on the surface. By the foregoing procedure, six array substrates 30 are completed on the single sheet of glass substrate 30A. Then, as illustrated in FIG. 15, along the outline shape of the array substrates 30, i.e., along the portions exposed in the second exposure step that is repeatedly performed, the sealant 40 is coated over the glass substrate 30A (sealant coating step). By the stage where the sealant 40 is coated over the glass substrate 30A, all of the thin-film patterns constituting the array substrate 30 have been formed on the glass substrate 30A as described above. However, in FIG. 15, for brevity of description, only the thin-film patterns TP1 of the gate wiring 36G and the gate electrode 32G are illustrated.

A method for manufacturing the color filter substrate 20 will be briefly described. In the case of the color filter substrate 20, as in the case of the array substrate 30, six liquid crystal panels 10 are manufactured from a single sheet of glass substrate 20A by cutting the single sheet of glass substrate 20A in a step as will be described later. In the manufacturing process for the color filter substrate 20, first, a thin film of light shield portions 23 is formed on the glass substrate 20A, and processed into a substantially grid by photolithography process. The light shield portions 23 are formed from titanium (Ti), for example. Then, the colored portions constituting the color filters 22 are formed in desired positions. Then, a transparent insulating film serving as a protection film is formed so as to cover the light shield portions 23 and the color filters 22. The insulating film is formed from silicon dioxide (SiO2), for example. Thereafter, on the surface of the insulating film, an alignment film 10A is formed. In this way, six color filter substrates 20 are completed on the single sheet of glass substrate 20A.

After the glass substrate 30A including the six array substrates 30 thereon and the glass substrate 20A including the six color filter substrates 20 thereon are completed and the sealant coating step is finished, the glass substrates 20A, 30A are then bonded to each other via the sealant 40, whereby a bonded substrate is formed. In the above-described sealant coating step, the sealant 40 is coated along the portions exposed in the second exposure step, resulting in a state in which the plurality of thin-film patterns is formed on the inside of the region enclosed by the sealant 40. Accordingly, when the glass substrates 20A, 30A are bonded, the plurality of thin-film patterns constituting the array substrate 30 is placed in a state of being disposed on the inside of the sealant 40. As a result, the plurality of thin-film patterns constituting the array substrate 30 is placed in a state of being sealed by the sealant 40, where the thin-film patterns are made waterproof, dust-proof, and contact-proof, for example.

Next, the boundary portions of the portions corresponding to the six locations of the bonded substrates are cut along the outline shape of the liquid crystal panels 10 to be formed, thus cutting the bonded substrates into six parts. In this step, the gaps between adjacent sealants 40 are cut along the boundary portions of the portions corresponding to the six locations. Then, with respect to each of the six bonded substrates obtained by the cutting, the liquid crystal layer 18 is injected into the gap between the array substrate 30 and the color filter substrate 20, thus filling the gap of the substrates 20, 30 with the liquid crystal layer 18. Thereafter, with respect to each bonded substrate, the polarization plates 10C, 10D are respectively bonded to the outer sides of the substrates 20, 30, whereby six liquid crystal panels 10 are completed.

As described above, according to the method of manufacturing the array substrate 30 according to the present embodiment, the resist film RF1 is partially exposed via a photomask in the first exposure step. In this way, the portions of the resist film RF1 except for the patterns corresponding to the fine patterns of the TFTs 32 and the like to be formed on the array substrate 30 can be exposed with high accuracy. Then, in the second exposure step, the resist film RF1 is scanned and irradiated with light along the outline shape of the array substrate 30. In this way, the portions of the resist film RF1 along the outline shape of the array substrate 30 can be exposed without using a photomask. Thereafter, parts of the resist film RF1 that have been exposed in the first exposure step and the second exposure step are removed in the developing step. In this way, the resist patterns RP1 with the outline portions shaped in correspondence to the outline shape of the array substrate 30 can be formed. By performing the etching step and the peeling step using the resist patterns RP1 as a mask, the thin-film patterns TP1 with the outline portions shaped in correspondence to the outline shape of the array substrate 30 can be formed on the glass substrate 30A. Thereafter, by cutting the glass substrate 30A along the outline shape of the array substrate 30, the array substrate 30 having the desired outline shape can be manufactured.

Thus, according to the method of manufacturing the array substrate 30 according to the present embodiment, the outline portions of the patterns of the TFTs 32 and the like can be patterned into the shape corresponding to the outline shape of the array substrate 30 without using a photomask. Accordingly, only by using a single photomask for each patterning of the TFTs 32 and the like, the thin-film pattern corresponding to the desired outline shape of the array substrate 30 can be formed on the glass substrate 30A. That is, when the liquid crystal panel 10 with a different outline shape is to be manufactured, the second exposure step may be performed along the intended outline shape of the liquid crystal panel 10, whereby a glass substrate that does not have the thin films in the portions along the outline can be produced. By cutting the glass substrate along the outline, an array substrate that does not have the thin films exposed in the outer portion can be manufactured. Accordingly, even when the array substrate 30 (liquid crystal panel 10) with a different outline shape is to be manufactured, the array substrate 30 (liquid crystal panel 10) with the desired outline shape can be manufactured without increasing the number of the photomasks used. In this way, the manufacturing cost can be decreased.

In addition, in the array substrate 30 manufactured by the manufacturing method of the present embodiment, as described above, in the vicinity of the display region A1 and the frame region A3, the end portion of the gate wiring 36G facing the frame region A3 is tapered with a gradual inclination angle. If the end portion of the gate wiring 36G facing the frame region A3 is substantially vertical or inversely tapered with respect to the glass substrate 30A, an air gap may be produced between the end portion of the gate wiring 36G and the gate insulating film 38 when the gate insulating film is formed, possibly reducing the adhesion between the gate wiring 36G and the gate insulating film. In contrast, according to the present embodiment, the end portion of the gate wiring 36G is gradually tapered as described above. Accordingly, in the vicinity of the display region A1 and the frame region A3, a decrease in the adhesion between the end portion of the gate wiring 36G and the gate insulating film 38 can be prevented or suppressed.

Further, in the array substrate 30 manufactured by the manufacturing method of the present embodiment, as described above, in the display region A1, the end portion of the gate wiring 36G is tapered with a steep inclination angle. Accordingly, high resolution can be maintained in each pixel in the display region A1.

Second Embodiment

With reference to FIG. 16 to FIG. 19, a second embodiment will be described. According to the method of manufacturing the array substrate 130 in the second embodiment, in the second exposure step that is repeatedly performed, the irradiation width of the light with which the resist film is scanned and irradiated is varied. Specifically, with respect to the plurality of thin-film patterns formed on the glass substrate 30A, the resist pattern for forming a thin-film pattern on the relatively upper layer side is formed by decreasing the irradiation width of the light with which the resist film is scanned and irradiated in the second exposure step, compared with the resist pattern for forming a thin-film pattern on the relatively lower layer side.

As a result, in the vicinity of the portion irradiated with light in the second exposure step (the boundary portion between the display region A1 and the frame region A3), the end portion of the thin-film pattern on the lower layer side becomes covered with the end portion of the thin-film pattern on the upper layer side. That is, in the array substrate 130 manufactured by the manufacturing method of the present embodiment, as illustrated in the cross sectional view of FIG. 16, in the boundary portion between the display region A1 and the frame region A3, the end portion of the gate insulating film 138 is covered with the first protection film 139A formed on the upper layer side of the gate insulating film 138, the end portion of the first protection film 139A is covered with the common electrode 135 formed on the upper layer side of the first protection film 139A, the end portion of the common electrode 135 is covered with the second protection film 139B formed on the upper layer side of the common electrode 135, and the end portion of the second protection film 139B is covered with the pixel electrode 134 formed on the upper layer side of the second protection film 139B.

Figure 17:
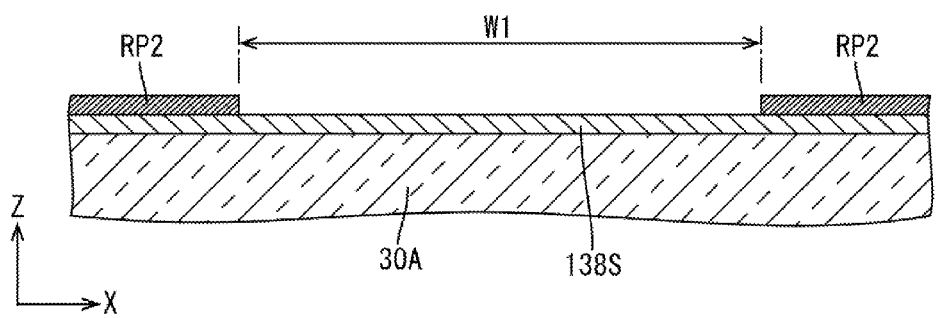
FIG. 17 is a cross sectional view illustrating an array substrate manufacturing step (1) according to the second embodiment.

Next, the above-described manufacturing method of the present embodiment will be described with reference to the cross sectional views (FIG. 17 to FIG. 19) of the portion (frame region A3) irradiated with light in the second exposure step. In the method of manufacturing the array substrate 130 according to the present embodiment, first, the gate wiring 36G and the gate electrode 32G are formed on the glass substrate 30A. Then, with respect to the silicon oxide film 138S constituting the gate insulating film 138, the film forming step, the resist film forming step, the first exposure step, the second exposure step, and the developing step are performed in order. In this way, as illustrated in FIG. 17, in the frame region A3, the resist film is removed along the outline shape of the array substrate 130 in the irradiation width W1 of the light in the second exposure step, whereby the resist pattern RP2 is formed on the silicon oxide film 138S. Thereafter, with respect to the silicon oxide film 138S, the etching step and the exposure step are performed to form the gate insulating film 138, and then the semiconductor film 36, source electrode 32S, source wiring, and drain electrode 32D constituting the TFT are configured in order.

Figure 18:
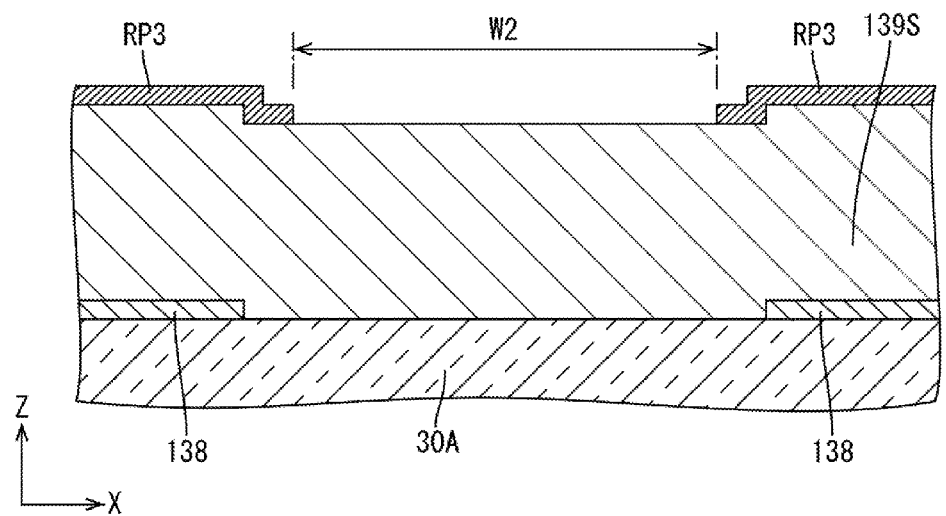
FIG. 18 is a cross sectional view illustrating an array substrate manufacturing step (2) according to the second embodiment.

Next, on the surface of the source electrode 32S, source wiring, and drain electrode 32D, a silicon oxide film 139S constituting the first protection film 139A is formed. Then, with respect to the silicon oxide film 139S formed, the resist film forming step, the first exposure step, the second exposure step, and the developing step are performed in order. In this way, in the frame region A3, a resist pattern RP3 is formed on the silicon oxide film 139S. In this case, the irradiation width W2 (see FIG. 18) of the light in the second exposure step is made smaller than the irradiation width W1 of the light in the second exposure step in the process of forming the gate insulating film 138. As a result, as illustrated in FIG. 18, in the frame region A3, the width size of the resist film removed in the developing step becomes smaller than the width size of the resist film that is removed during the process of forming the gate insulating film 138. As the exposure device for decreasing the irradiation width of the light (defocusing) in the second exposure step, an existing exposure device having a defocus function may be used.

Figure 19:
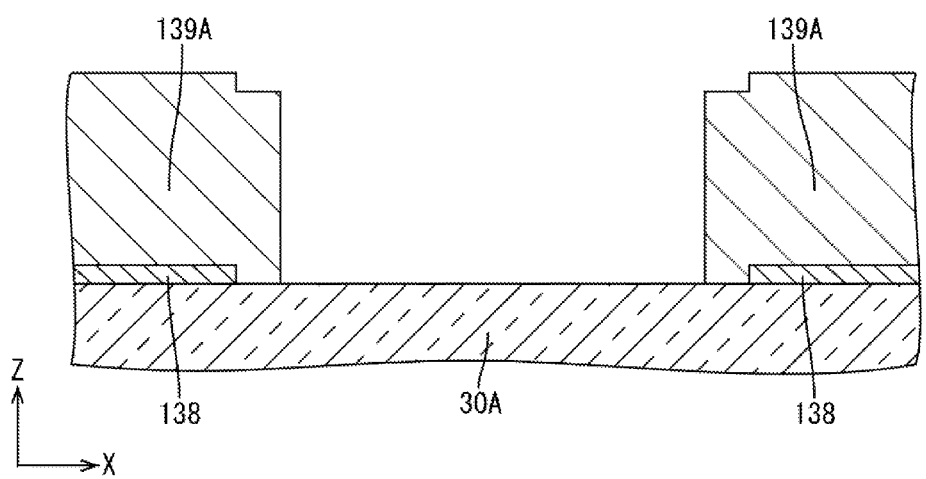
FIG. 19 is a cross sectional view illustrating an array substrate manufacturing step (3) according to the second embodiment.

Next, using the resist pattern RP3 formed on the silicon oxide film 139S as a mask, the etching step and the peeling step are performed with respect to the silicon oxide film 139S, whereby the first protection film 139A is formed. As a result, in the frame region A3, as illustrated in FIG. 19, the end portion of the gate insulating film 138 becomes covered with the first protection film 139A formed on the upper layer side of the gate insulating film 138. Then, on the surface of the first protection film 139A, a transparent electrode film constituting the common electrode 135 is formed, and the resist film forming step, the first exposure step, the second exposure step, and the developing step are performed in order. In this case, the irradiation width of the light in the second exposure step is made smaller than the irradiation width of the light W2 in the second exposure step during the process of forming the first protection film 139A. Thereafter, the etching step and the peeling step are performed, whereby, in the frame region A3, the end portion of the first protection film 139A becomes covered with the common electrode 135 formed on the upper layer side of the first protection film 139A.

Figure 16:
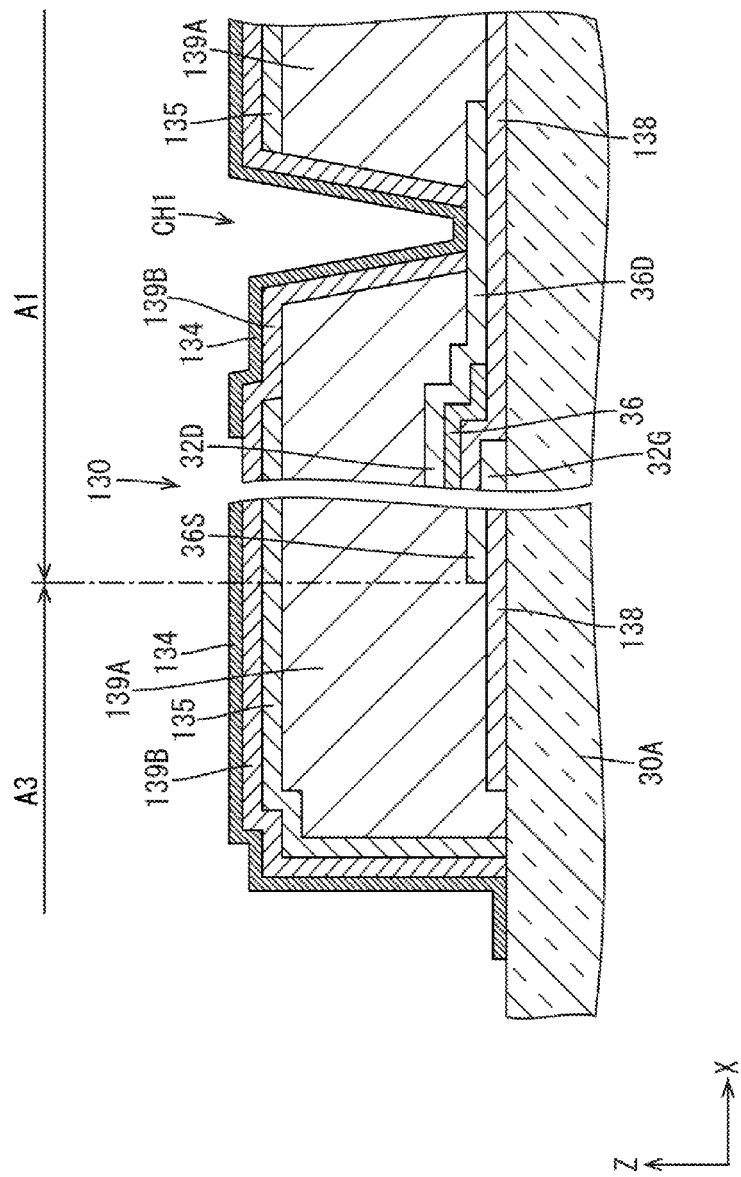
FIG. 16 is a cross sectional view illustrating, in an array substrate according to a second embodiment, a cross sectional configuration in the vicinity of a TFT, and a cross sectional configuration of a boundary portion between a display region and a frame region.

Thereafter, similarly with respect to the second protection film 139B formed on the upper layer side of the common electrode 135, and the pixel electrode 134 formed on the upper layer side of the second protection film 139B, the irradiation width of the light in the second exposure step is decreased when formed, compared with the irradiation width of the light in the second exposure step during the formation of the films disposed on the lower layer side thereof. As a result, the array substrate 130 is formed such that, in the frame region A3, as illustrated in FIG. 16, the end portion of the common electrode 135 is covered with the second protection film 139B formed on the upper layer side of the common electrode 135, and the end portion of the second protection film 139B is covered with the pixel electrode 134 formed on the upper layer side of the second protection film 139B.

If a part of the thin-film pattern formed on the lower layer side is exposed from the thin film formed on the upper layer side, when a part of the thin film on the upper layer side is removed by etching, the part of the thin-film pattern formed on the lower layer side could be unintentionally etched. In this respect, according to the manufacturing method of the present embodiment, as described above, the array substrate 130 can be manufactured such that, in the vicinity (frame region A3) of the portion irradiated with light in the second exposure step, the end portion of the thin-film pattern on the lower layer side is covered with the end portion of the thin-film pattern on the upper layer side. Accordingly, a part of the thin-film pattern on the lower layer side can be prevented from being unintentionally etched, thereby suppressing the development of a defect in the part of the thin-film pattern on the lower layer side. Thus, according to the present embodiment, the development of a defect in a part of the thin-film pattern on the lower layer side can be suppressed without modifying the scan path of the light that performs scanning and irradiation in the second exposure step.

According to the manufacturing method of the present embodiment, in the second exposure step that is repeatedly performed, the exposure device having a defocus function is used. In this way, the end portion of the thin-film pattern on the lower layer side can be formed so as to be covered with the end portion of the thin-film pattern on the upper layer side, without modifying the scan path of the light that performs scanning and irradiation in the second exposure step. Accordingly, in the second exposure step that is repeatedly performed, the scan path of the scanning light over the glass substrate 30A can be equalized.

Third Embodiment

Figure 20:
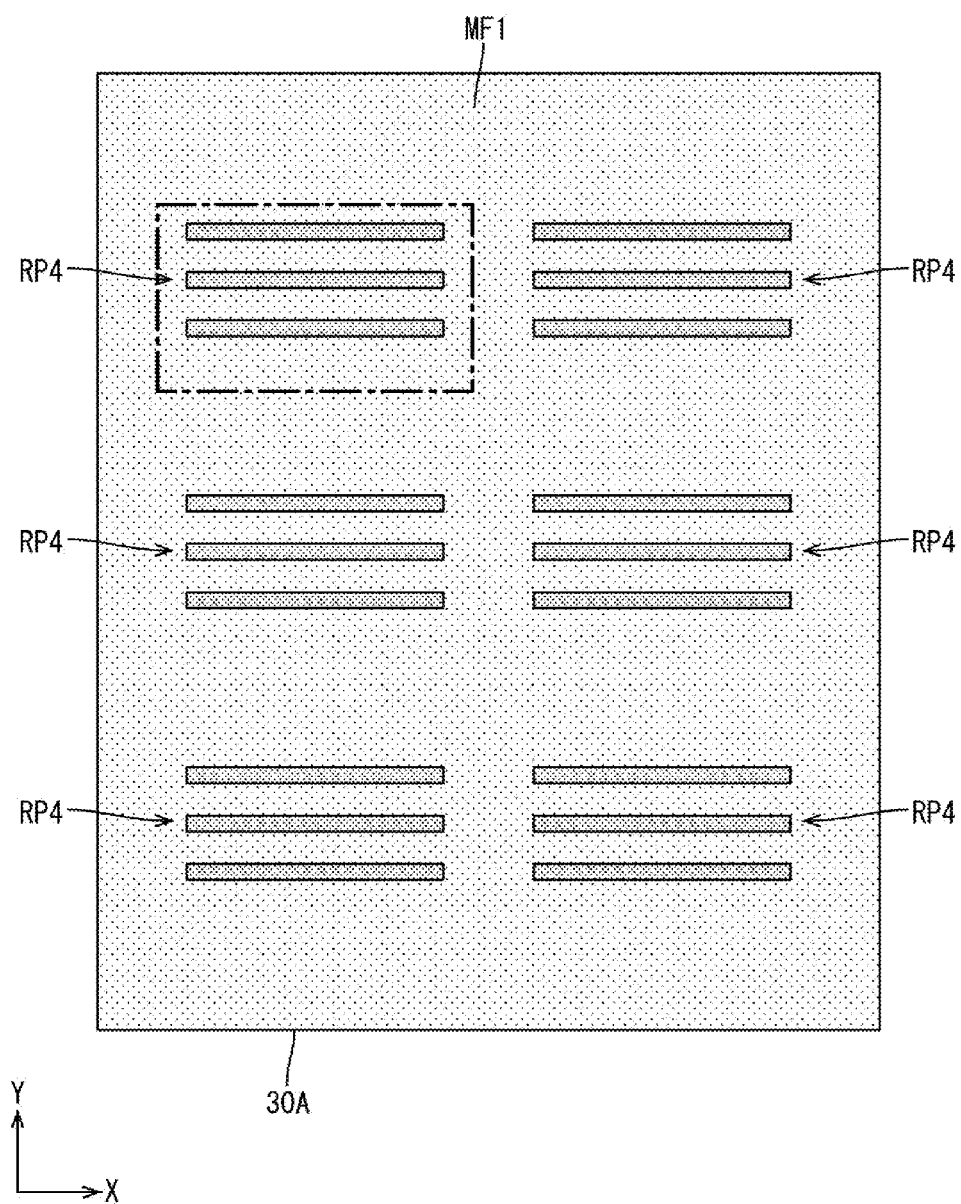
FIG. 20 is a plan view illustrating an array substrate manufacturing step according to a third embodiment.

With reference to FIG. 20, a third embodiment will be described. In the third embodiment, the outline shape of the liquid crystal panel as viewed in plan is rectangular. Accordingly, in the method for manufacturing the array substrate according to the third embodiment, in the second exposure step with respect to a metal laminate film MF1 constituting the gate wiring and the gate electrode, for example, the scan path of the scanning and irradiating light is rectangular (see the dot-and-dash line in FIG. 20). Thereafter, the developing step is performed, whereby resist patterns RP4 corresponding to the outline shape of the liquid crystal panel are formed on the metal laminate film MF1, as illustrated in FIG. 20.

Fourth Embodiment

Figure 21:
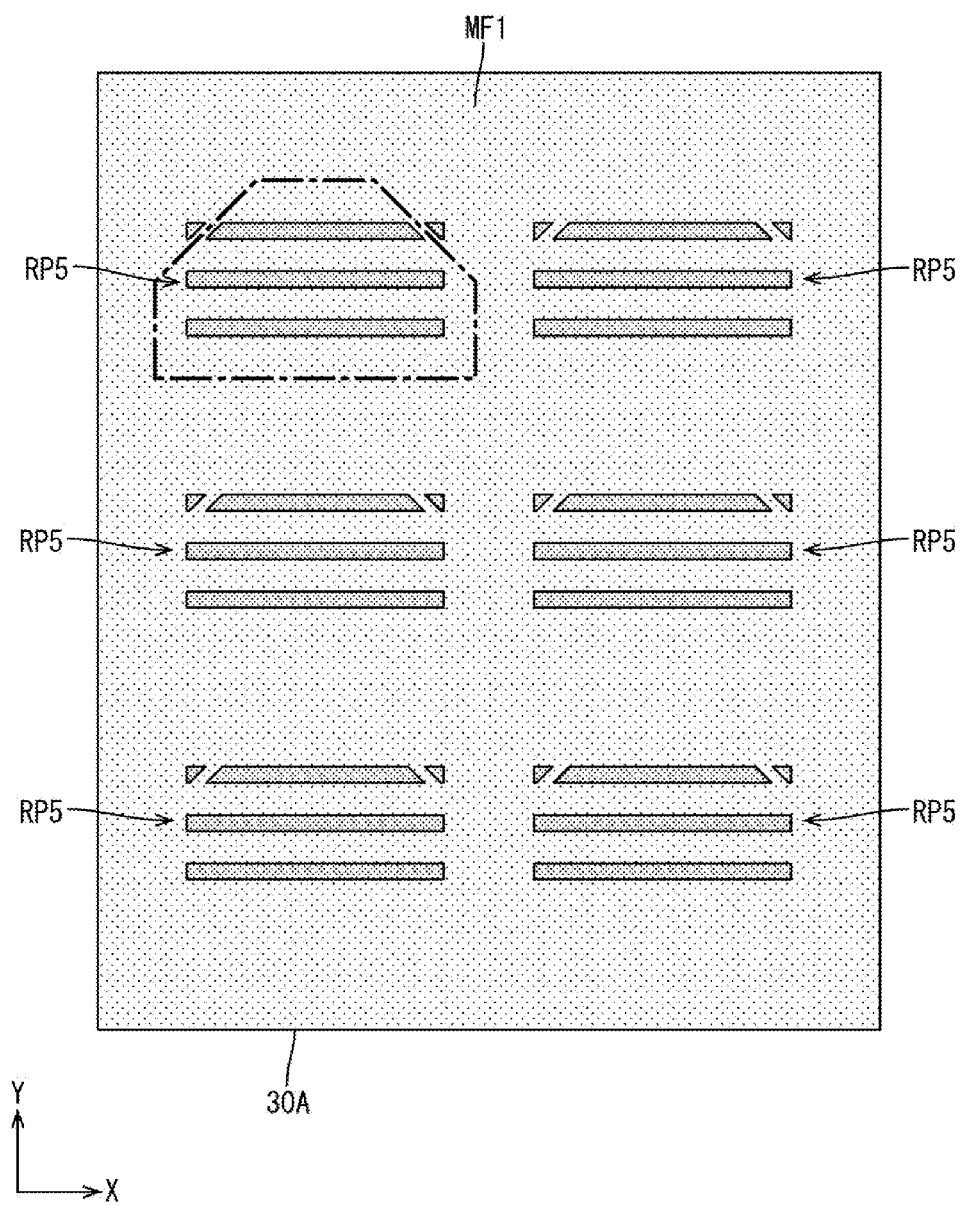
FIG. 21 is a plan view illustrating an array substrate manufacturing step according to a fourth embodiment.

With reference to FIG. 21, a fourth embodiment will be described. In the fourth embodiment, the outline shape of the liquid crystal panel as viewed in plan is trapezoidal. Accordingly, in the method of manufacturing the array substrate according to the fourth embodiment, in the second exposure step with respect to the metal laminate film MF1 constituting the gate wiring and the gate electrode, for example, the scan path of the scanning and irradiating light is trapezoidal (see the dot-and-dash lines in FIG. 21). Thereafter, the developing step is performed, whereby, as illustrated in FIG. 21, resist patterns RP5 corresponding to the outline shape of the liquid crystal panel are formed on the metal laminate film MF1.

Fifth Embodiment

Figure 22:
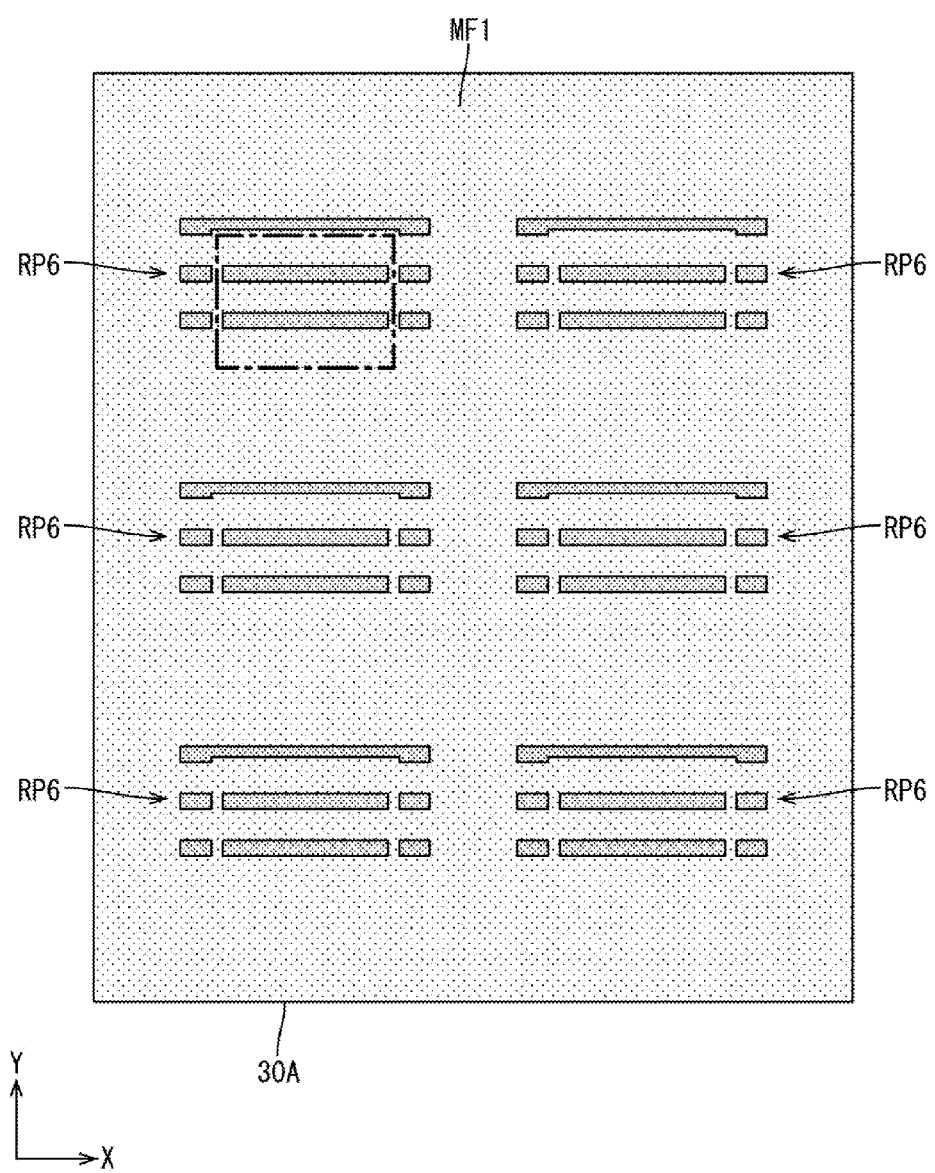
FIG. 22 is a plan view illustrating an array substrate manufacturing step according to a fifth embodiment.

With reference to FIG. 22, a fifth embodiment will be described. In the fifth embodiment, the outline shape of the liquid crystal panel as viewed in plan is a smaller rectangle than that in the third embodiment. Accordingly, in the method of manufacturing the array substrate according to the fifth embodiment, in the second exposure step with respect to the metal laminate film MF1 constituting the gate wiring and the gate electrode, for example, the scan path of the scanning and irradiating light is a small rectangle (see the dot-and-dash lines in FIG. 22). Thereafter, the developing step is performed, whereby, as illustrated in FIG. 22, resist patterns RP6 corresponding to the outline shape of the liquid crystal panel are formed on the metal laminate film MF1.

As described above, in the manufacturing methods according to the third embodiment to the fifth embodiment, regardless of the outline shape of the liquid crystal panel being different from that of the first embodiment, a thin-film pattern corresponding to the outline shape of the liquid crystal panel can be formed on the glass substrate 30A by simply using a single photomask for each pattern of the TFTs and the like in the first exposure step that is repeatedly performed, without using a photomask in the second exposure step that is repeatedly performed for forming the plurality of thin-film patterns on the array substrate. The pattern of the TFTs and the like formed on the glass substrate 30A is the same as that of the first embodiment. Accordingly, even when the outline shape of the liquid crystal panel is different, the liquid crystal panel can be manufactured using the same number of photomasks as in the first embodiment. Accordingly, an increase in the number of photomasks can be suppressed, and a decrease in manufacturing cost can be achieved.

Modifications of the embodiments are listed below.

(1) In the foregoing embodiments, ultraviolet laser is described as a specific example of the irradiating light in the second exposure step. However, this is not a limitation. For example, in the second exposure step, an ultraviolet ray LED may be used for irradiation, or a mercury lamp may be focused and used for irradiation.

(2) In the foregoing embodiments, in the second exposure step, the resist film is scanned once with the ultraviolet laser having a predetermined irradiation width byway of example. However, the resist film may be scanned a plurality of times with an ultraviolet laser having a small irradiation width.

(3) In the foregoing embodiments, the configuration in which the semiconductor film constituting a TFT is an In—Ga—Zn—O-based semiconductor is described by way of example. However, this is not a limitation. For example, a configuration in which the semiconductor film constituting a TFT is polysilicon or a CG silicon (Continuous Grain Silicon) may be adopted.

(4) In the foregoing embodiments, methods for manufacturing the liquid crystal panel of a FFS (Fringe Field Switching) type drive system are described by way of example. However, this is not a limitation. For example, the present invention may be applied in a manufacturing process for a liquid crystal panel in which the drive system is of IPS (In-Plane Switching) type, MVA (Multi-domain Vertical Alignment) type, or TN (Twisted Nematic) type.

(5) In the foregoing embodiments, methods for manufacturing an array substrate constituting a liquid crystal panel are described by way of example. However, this is not a limitation. The present invention is applicable for uses other than an array substrate constituting a liquid crystal panel. For example, the present invention may be applied in a manufacturing process for a substrate constituting an organic EL display device.

While embodiments of the present invention have been described in detail, the embodiments are merely exemplary, and do not limit the claims. The technology set forth in the claims may include modifications and variations of the specific examples described above by way of example.

EXPLANATION OF SYMBOLS

10: Liquid crystal panel
20: Color filter substrate
20A, 30A: Glass substrate
22: Color filter
30, 130: Array substrate
32: TFT
32G: Gate electrode
32S: Source electrode
32D: Drain electrode
34, 134: Pixel electrode
35, 135: Common electrode 36: Semiconductor film
36G: Gate wiring
36S: Source wiring
38, 138: Gate insulating film
39A, 139A: First protection film
39B, 139B: Second protection film
CH1: Contact hole
MF1: Metal laminate film
RF1: Resist film
RP1, RP2, RP3, RP4, RP5, RP6: Resist pattern
TP1: Thin-film pattern

The invention claimed is:

1. A method of manufacturing a display panel substrate having a semiconductor element, the method comprising:
    a film forming step of forming a thin film on a substrate;
    a resist film forming step, after the film forming step, of forming a positive resist film on the thin film;
    a first exposure step, after the resist film forming step, of selectively exposing a part of the resist film via a photomask including a pattern corresponding to at least a pattern of the semiconductor element;
    a second exposure step, after the first exposure step, of selectively exposing a part of the resist film by scanning and irradiating the resist film with light along an outline shape of the display panel substrate;
    a developing step, after the second exposure step, of developing the resist film so as to form a resist pattern on the thin film by removing a part of the resist film that is exposed in the first exposure step and the second exposure step;
    an etching step, after the developing step, of etching the thin film using the resist pattern as a mask, so as to selectively remove a part of the thin film and form a thin-film pattern; and
    a peeling step, after the etching step, of peeling the resist pattern from the thin-film pattern.

2. The method of manufacturing a display panel substrate according to claim 1, wherein
    the steps from the film forming step to the peeling step are repeatedly performed to form a plurality of laminated thin-film patterns constituting at least the semiconductor element on the substrate; and
    in the second exposure step that is repeatedly performed, a scan path of scanning light over the substrate is equalized.

3. The method of manufacturing a display panel substrate according to claim 2, wherein the resist pattern formed on the thin film for forming the thin-film pattern on a relatively upper layer side is formed using a decreased irradiation width of the light with which the resist film is scanned and irradiated in the second exposure step, compared with the resist pattern formed on the thin film for forming the thin-film pattern on a relatively lower layer side.

4. The method of manufacturing a display panel substrate according to claim 1, further comprising a sealant coating step of coating a sealant on the substrate along a scan path of the scanning and irradiating light in the second exposure step.

* * * * *